(12) United States Patent
Lockard et al.

(10) Patent No.: US 11,821,918 B1
(45) Date of Patent: Nov. 21, 2023

(54) BUCKLING BEAM PROBE ARRAYS AND METHODS FOR MAKING SUCH ARRAYS INCLUDING FORMING PROBES WITH LATERAL POSITIONS MATCHING GUIDE PLATE HOLE POSITIONS

(71) Applicant: Microfabrica Inc., Van Nuys, CA (US)

(72) Inventors: Michael S. Lockard, Lake Elizabeth, CA (US); Stefano Felici, San Jose, CA (US); Uri Frodis, Los Angeles, CA (US); Dennis R. Smalley, Newhall, CA (US)

(73) Assignee: MICROFABRICA INC., Van Nuys, CA (US)

( * ) Notice: Subject to any disclaimer, the term of this patent is extended or adjusted under 35 U.S.C. 154(b) by 0 days.

(21) Appl. No.: 17/240,962

(22) Filed: Apr. 26, 2021

Related U.S. Application Data

(60) Provisional application No. 63/015,450, filed on Apr. 24, 2020.

(51) Int. Cl.
*G01R 1/073* (2006.01)
*G01R 1/067* (2006.01)

(52) U.S. Cl.
CPC ..... *G01R 1/06744* (2013.01); *G01R 1/06761* (2013.01); *G01R 1/07357* (2013.01)

(58) Field of Classification Search
CPC ...... G01R 1/06722; G01R 1/06; G01R 1/067; G01R 1/06705; G01R 1/06711;
(Continued)

(56) References Cited

U.S. PATENT DOCUMENTS 5,225,777 A    7/1993   Brass et al.
5,989,994 A   11/1999   Khoury et al.
(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.
(Continued)

*Primary Examiner* — Lee E Rodak
(74) *Attorney, Agent, or Firm* — Perkins Coie LLP

(57) ABSTRACT

Embodiments are directed to the formation of buckling beam probe arrays having MEMS probes that are engaged with guide plates during formation or after formation of the probes while the probes are held in the array configuration in which they were formed. In other embodiments, probes may be formed in, or laterally aligned with, guide plate through holes. Guide plate engagement may occur by longitudinally locating guide plates on probes that are partially formed or fully formed with exposed ends, by forming probes within guide plate through holes, by forming guide plates around probes, or forming guide plates in lateral alignment with arrayed probes and then longitudinally engaging the probes and the through holes of the guide plates. Final arrays may include probes and a substrate to which the probes are bonded along with one or more guide plates while in other embodiments final arrays may include probes held by a plurality of guide plates (e.g. 2, 3, 4 or even more guide plates) with aligned or laterally shifted hole patterns.

19 Claims, 32 Drawing Sheets

(58) Field of Classification Search
CPC ............ G01R 1/06716; G01R 1/06727; G01R 1/06733; G01R 1/06738; G01R 1/06744; G01R 1/0675; G01R 1/06755; G01R 1/06761; G01R 1/06766; G01R 1/06772; G01R 1/06777; G01R 1/073; G01R 1/07307; G01R 1/07314; G01R 1/07321; G01R 1/07328; G01R 1/07335; G01R 1/07342; G01R 1/0735; G01R 1/07357; G01R 1/07364; G01R 1/07371; G01R 1/07378; G01R 1/07385; G01R 1/07392

See application file for complete search history.

(56) References Cited

U.S. PATENT DOCUMENTS

| | | |
|---|---|---|
| 6,046,597 A | 4/2000 | Barabi |
| 6,255,727 B1 | 7/2001 | Khoury |
| 6,297,164 B1 | 10/2001 | Khoury et al. |
| 6,344,752 B1 | 2/2002 | Hagihara et al. |
| 6,354,859 B1 | 3/2002 | Barabi et al. |
| 6,420,884 B1 | 7/2002 | Khoury et al. |
| 6,436,802 B1 | 8/2002 | Khoury |
| 6,466,043 B2 | 10/2002 | Khoury et al. |
| 6,471,538 B2 | 10/2002 | Zhou et al. |
| 6,472,890 B2 | 10/2002 | Khoury et al. |
| 6,504,223 B1 | 1/2003 | Zhou et al. |
| 6,535,003 B2 | 3/2003 | Aldaz et al. |
| 6,540,524 B1 | 4/2003 | Khoury et al. |
| 6,579,804 B1 | 6/2003 | Zhou et al. |
| 6,586,955 B2 | 7/2003 | Fjelstad et al. |
| 6,608,385 B2 | 8/2003 | Zhou et al. |
| 6,641,430 B2 | 11/2003 | Zhou et al. |
| 6,667,628 B2 | 12/2003 | Ahrikencheikh et al. |
| 6,676,438 B2 | 1/2004 | Zhou et al. |
| 6,722,032 B2 | 4/2004 | Beaman et al. |
| 6,729,019 B2 | 5/2004 | Grube et al. |
| 6,838,894 B2 | 1/2005 | MacIntyre |
| 6,856,156 B2 | 2/2005 | Liang et al. |
| 6,859,054 B1 | 2/2005 | Zhou et al. |
| 6,864,105 B2 | 3/2005 | Grube et al. |
| 6,911,835 B2 | 6/2005 | Chraft et al. |
| 6,920,689 B2 | 7/2005 | Khandros et al. |
| 6,965,244 B2 | 11/2005 | Miller |
| 6,965,245 B2 | 11/2005 | Kister et al. |
| 6,967,493 B2 | 11/2005 | Mori et al. |
| 7,024,763 B2 | 4/2006 | Mathieu et al. |
| 7,106,080 B2 | 9/2006 | Mori et al. |
| 7,122,760 B2 | 10/2006 | Mathieu et al. |
| 7,378,734 B2 | 5/2008 | Yabuki et al. |
| 7,425,839 B2 | 9/2008 | Stutzman et al. |
| 7,637,006 B2 | 12/2009 | Tunaboylu et al. |
| 7,640,651 B2 | 1/2010 | Cohen et al. |
| 7,786,740 B2 | 8/2010 | Kister |
| 7,825,675 B2 | 11/2010 | Breinlinger |
| 8,202,684 B2 | 6/2012 | Hamada et al. |
| 8,907,689 B2 | 12/2014 | Kister et al. |
| 10,119,994 B2 | 11/2018 | Choi et al. |
| 2002/0048973 A1 | 4/2002 | Zhou et al. |
| 2003/0176066 A1 | 9/2003 | Zhou et al. |
| 2005/0108875 A1 | 5/2005 | Mathieu et al. |
| 2005/0142739 A1 | 6/2005 | Kumar et al. |
| 2006/0108678 A1 | 5/2006 | Kumar et al. |
| 2007/0057685 A1 | 3/2007 | Garabedian et al. |
| 2007/0075717 A1 | 4/2007 | Kinghorn et al. |
| 2007/0152685 A1 | 7/2007 | Eldridge et al. |
| 2008/0105355 A1 | 5/2008 | Kumar et al. |
| 2009/0155724 A1* | 6/2009 | Jo ............................ G01R 3/00 430/312 |
| 2011/0221465 A1 | 9/2011 | Lee |
| 2018/0003767 A1* | 1/2018 | Crippa ............... G01R 31/2891 |
| 2021/0123949 A1* | 4/2021 | Chu ......................... G01R 3/00 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Hill, Dr. Steve, "An E-FAB Way for Making the Micro World", Materials World is the journal of The Institute of Materials, Sep. 1999, vol. 7, No. 9, pp. 538-539.

Madden, John D. et al., "Three-Dimensional Microfabrication by Localized, Electrochemical Deposition", J. of Micro. Sys., Mar. 1996, 5(1):24-32.

Madou, Mark J., "Fundamentals of Microfabrication—The Science of Miniaturization", 2nd ed., 2001, pp. 402-412.

Marques, et al., "Fabrication of High-Aspect-Ratio Microstructures on Planar and Nonplanar Surfaces Using a Modified LIGA Process", Dec. 1997, 6(4):329-336.

Weeden, Otto, Keithley Instruments, Inc. "Probe Card Tutorial", pp. 1-40.

* cited by examiner

Example Guide Plate (GP) Supply / Formation Variations — 700-A (1) Positioning a preformed conductive, dielectric, or composite GP (e.g. a dielectric ceramic GP, a dielectric ceramic GP with selective areas provided with a metal coating, a metal GP with selective areas provided with a dielectric coating).

(A) A GP is aligned with and slid longitudinally over exposed portions of probes which are held in relatively fixed lateral positions by only a relatively short distance (e.g. less than 10% to 50% of probe length) that extends beyond a substrate, sacrificial material, or a previously positioned GP that fixes the probe positions. If probe formation is not completed at the time of GP placement, it may be continued after placement.

(B) A GP is aligned with lateral positions of probes. It is then placed longitudinally against an existing layer or substrate surface with longitudinal portions of the probes being formed potentially below the holes, through the holes, and above the holes.

(2) Positioning a preformed GP like that of (1) but with the through holes having a sacrificial material coating or non-stick material coating the surface(s) thereof, with positioning similar, mutatis mutandis, to that noted in (1)(A) – (1)(B).

(3) A GP is formed around protruding ends of completed or of partially formed probes, e.g. prior to surrounding the ends with a sacrificial material or after removal of one or more layers of sacrificial material.

(A) Covering exposed ends of the probes with a thin coating of sacrificial material that can later be removed, or a non-stick material from which the probe can slide from a build location to an operational location after formation of the GP, and then depositing or applying a GP material.

(i) Depositing or applying a ceramic material, e.g. as a powder liquid, or slurry (by dispensing, spraying, spreading, electrophoretic deposition, and the like), and then solidifying it or allowing it to solidify, for example, high or low temperature firing, by electrochemical means, by application of pressure, and the like.

(ii) Depositing a non-ceramic dielectric in powder or liquid form and solidifying it to form the GP by, for example: (1) applying radiation, pressure, temperature, electric currents or fields, catalysts or other components to induce solidification or bonding, and/or (2) removal of solvent or other solidification or reaction inhibitors.

(iii) Optionally depositing a relatively thin conductive structural material to selected regions, e.g. by electrodeposition or PVD, depositing or applying a dielectric material and solidifying it and optionally selectively depositing a conductive structural material to the surface of the solidified dielectric to form a hybrid GP with conductive and dielectric regions.

(4) A GP is formed on a substrate or previously formed layer where the GP has been aligned with its through holes laterally positioned with respect to probe locations but without probes extending through the through holes at the time of formation where example formation methods are similar, mutatis mutandis, to those noted in (3)(i) to (3)(iii).

FIG. 7A

Example Probe Configurations

Straight probe formed as a single layer

FIG. 8A

Straight probe formed from multiple layers

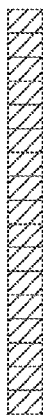

FIG. 8B

Straight probe with a notch (e.g. for preferential bending)

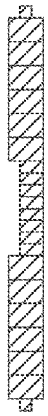

FIG. 8C

Straight probe with a notch (e.g. for preferential bending) and with dielectric regions for engaging conductive guide plate regions (e.g, in regions away from preferential bending)

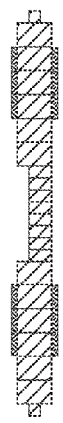

FIG. 8D

Angled multi-layer probe with vertical ends

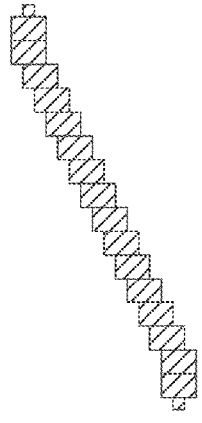

FIG. 8E

Additional Example Probe Configurations

Curved probes (Narrow C)

(Narrow S)

Probe formed from multiple materials including an elastic body, tip, and a core material Probe with parallel elastic beams and end tips Probe with guide plate stops and an intermediate dielectric spacer for inhibiting excessive movement or shorting

Probe-to-guide-plate interface variations ← 900

(1) Form probes and/or positioning pins and either position or form guide plates during or after probe formation such that the probes and/or positioning pins have configurations that engage guide plate through holes to provide longitudinal guide plate positioning limits or improved plate/probe movement.

→ (A) Form an upper end of probes or pins to have widths that can extend into the through holes of an upper guide plate while other portions of the probes have wider dimensions than corresponding dimensions of the through holes such that the configuration limits downward motion of an upper guide plate.

→ (B) Form a lower end of probes or pins that have widths that can extend into the through holes of a lower guide plate while other portions of the probes have wider dimensions than corresponding dimensions of the through holes such that the configuration limits upward motion of a lower guide plate.

→ (C) Form probes or pins with wider feature(s) than corresponding dimensions of a through hole in an upper guide plate that is to be formed or placed, then form or place the guide plate, then continue forming the probes or pins with regions extending through the through holes and with at least one or more having a wider feature than a corresponding dimension of a through hole in an upper guide plate that was previously formed or placed such that the upper guide plate has its longitudinal motion limited from both above and below.

→ (D) Form probes or pins with wider feature(s) than corresponding dimensions of a through hole in a lower guide plate that is to be formed or placed, then form or place the guide plate, then continue forming the probes or pins with at least one or more having a wider feature than a corresponding dimension of a through hole in the lower guide plate that was previously formed or placed such that the lower guide plate has its longitudinal motion limited from both above and below.

→ (E) Form one or more probes or pins in a manner analogous to any of (A) – (D) but where the guide plate or plates are intermediate guide plates.

→ (F) Form probes from a single layer or at least critical portions of the probes from a single layer (e.g. so that any presence of layer discontinuities do not interfere with probe movement through the guide plate(s).

→ (G) Form probes so a layer-to-layer interface region remains within the through holes of a guide plate and thus does not go from below or above the guide plate to within the through holes.

→ (H) Forming probes where layer-to-layer interface regions that can transition from inside-to-outside or outside-to-inside of through holes are configured such that such transitions do not result in a movement interfering stair step transition.

FIG. 9

Example illustrations Probe-to-Guide-Plate Interface Variations (1) Probes formed with wider bodies (A-1) or body portions (A-2) than upper tips (e.g. to act as upper stops for probe movement through an upper guide plate)

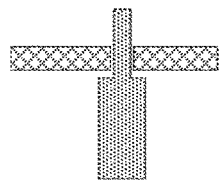
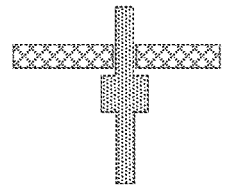

FIG. 10A-1     FIG. 10A-2

(2) Probes formed with wider bodies than lower tips (e.g. to act as lower stops for probe movement through a lower guide plate)

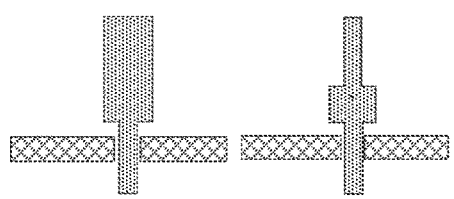

FIG. 10B-1     FIG. 10B-2

(3) Probes with one or more laterally expanded or narrowed regions (or both) to provide upper or lower motion stops (with different configurations in lateral X and Y directions).

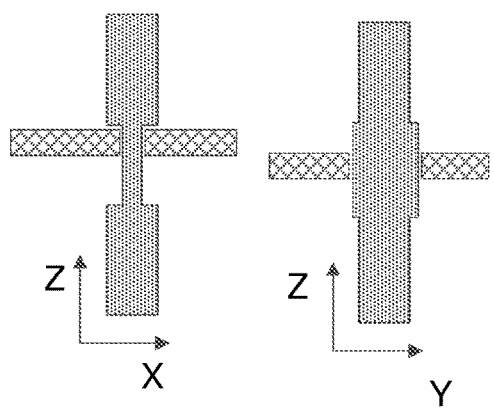

FIG. 10C

(4) Probes with narrowed and expanded regions and guide plates formed or located during formation of probes to provide for limited range of longitudinal motion in one or both directions.

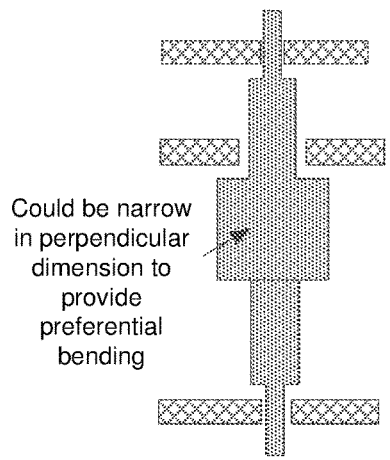

Could be narrow in perpendicular dimension to provide preferential bending

FIG. 10D

More Examples of Probe-to-Guide Plate Interface Variations (5) Probes are formed from a single layer.

(6) Probes having guide plate interface regions, through the entire range of longitudinal motion, that are effectively constrained to movement within a single layer.

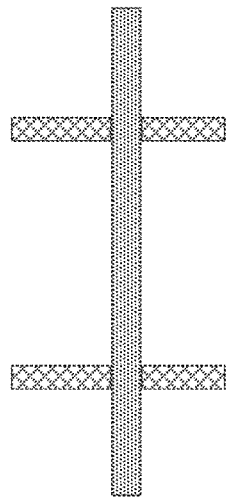

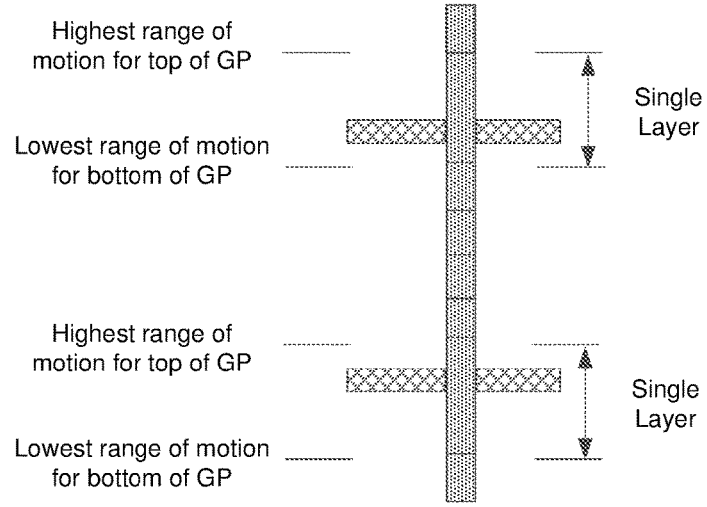

(7) Probes having guide plate interface locations, through an entire range of longitudinal motion, constructively limited to movement of the guide plate such that a layer-to-layer interface does not travel from below the guide plate to a bottom edge of the guide plate, from above the guide plate to an upper edge of the guide plate (i.e. the layer-to-layer interface remains above, below, or within the thickness of the guide plate)

(8) Probes with guide plate-to-probe interface regions formed with a transition in structural size from larger to smaller (to provide an inward offset on each side) such that (1) the larger region is always located within an opening in the guide plate and (2) such that an edge of the guide plate never encounters a motion inhibiting stair step transition (if the probe moves through the guide plate at an angle, it may only be necessary for one side of the probe to have an inward offset)

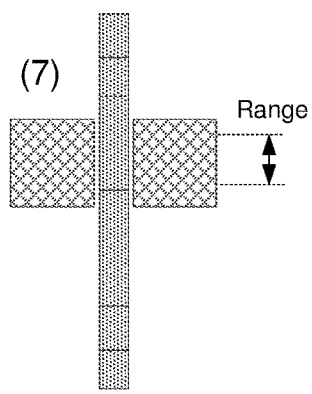

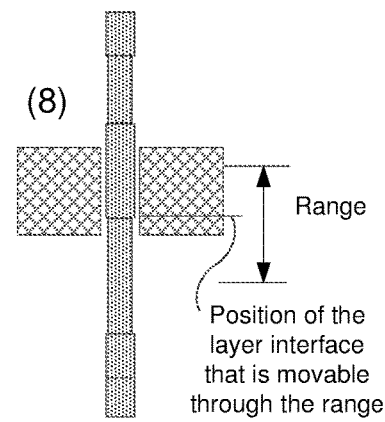

Embodiment #1: Forming a probe array with guide plate(s) inserted from above after probe formation and partial removal of sacrificial material
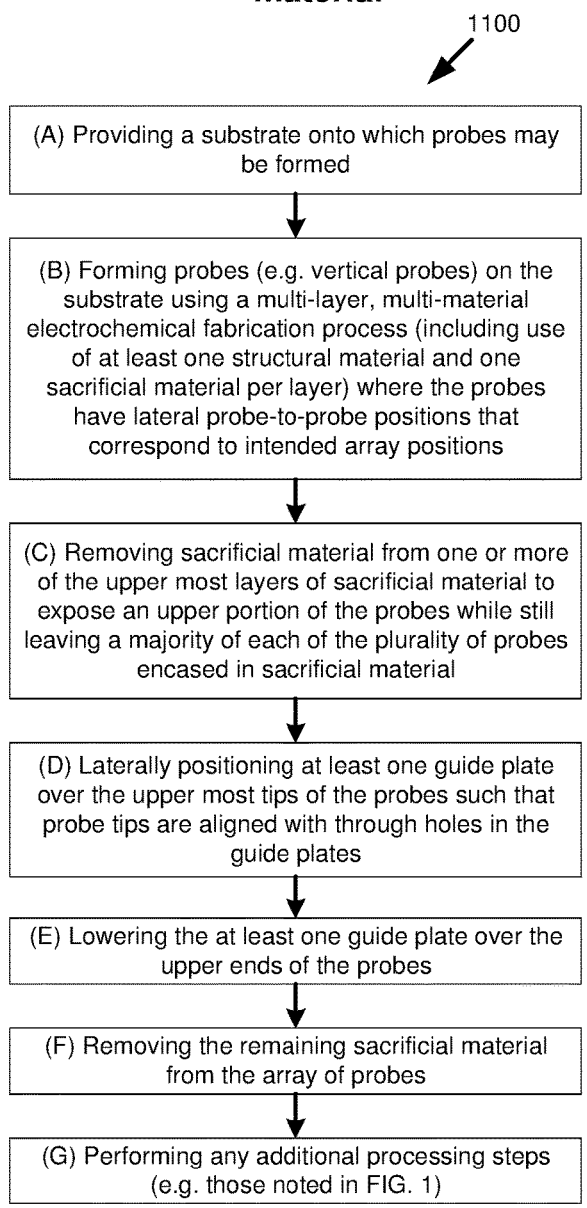
Embodiment #1: Sample illustrations of Steps 11(A) - 11(C)
FIG. 12A
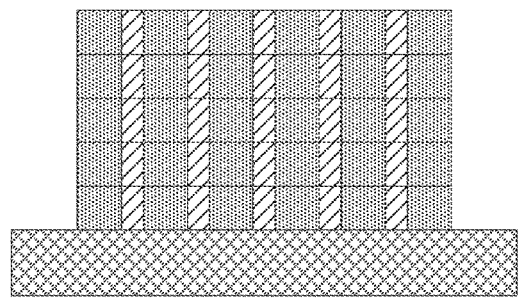
FIG. 12B
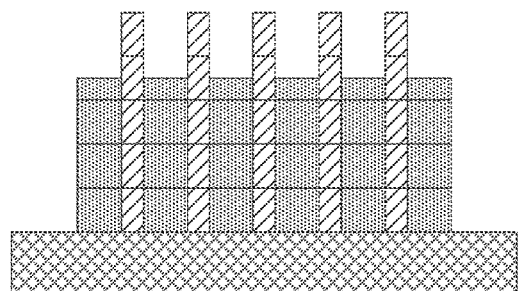
FIG. 12C
FIG. 11

Embodiment #1: Sample illustrations of Steps 11(D) – 11(G)

Removing sacrificial material and possibly heat treating probes

Optionally laterally offsetting the guide plate and the substrate

Embodiment #2: Formation of a probe array with a guide plate inserted from above after probe formation without initial removal of sacrificial material (with no sacrificial material on the final one or more layers)

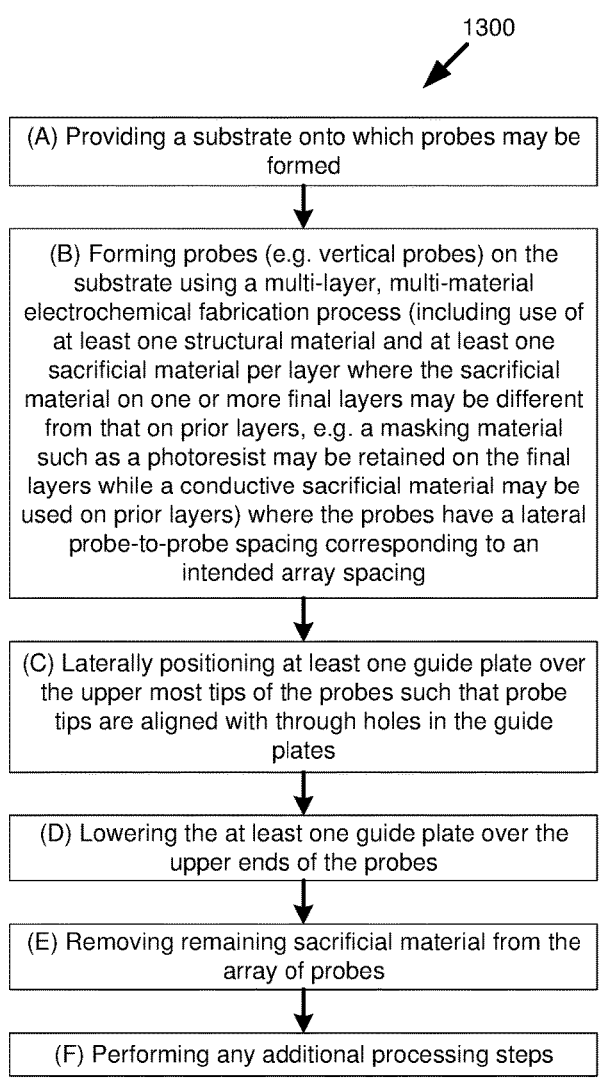

FIG. 13

Embodiment #2: Sample illustrations of Steps 13(A) - 13(B)

FIG. 14A

Layers formed with sacrificial material on lower layers and masking material (e.g. photoresist) still retained on last two layers

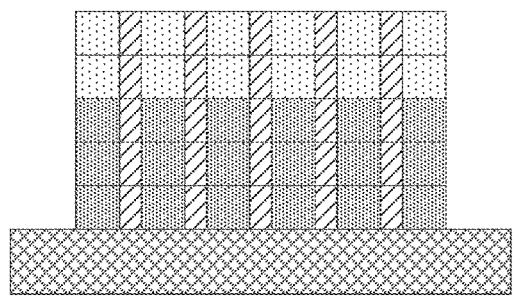

FIG. 14B-1

Masking material removed from final two layers

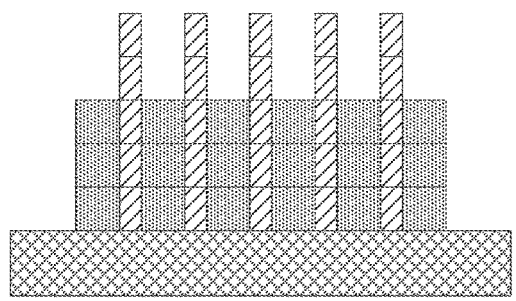

FIG. 14B-2

Embodiment #2: Sample illustrations of Steps 13(C) - 13(F)

Removal of sacrificial material and possibly heat treating

Optional lateral offsetting of guide plate relative to substrate

Embodiment #3: Formation of a probe array with guide plate(s) inserted from above and then below after probe formation
Embodiment #3: Sample illustrations of Steps 15(A) - 15(B)
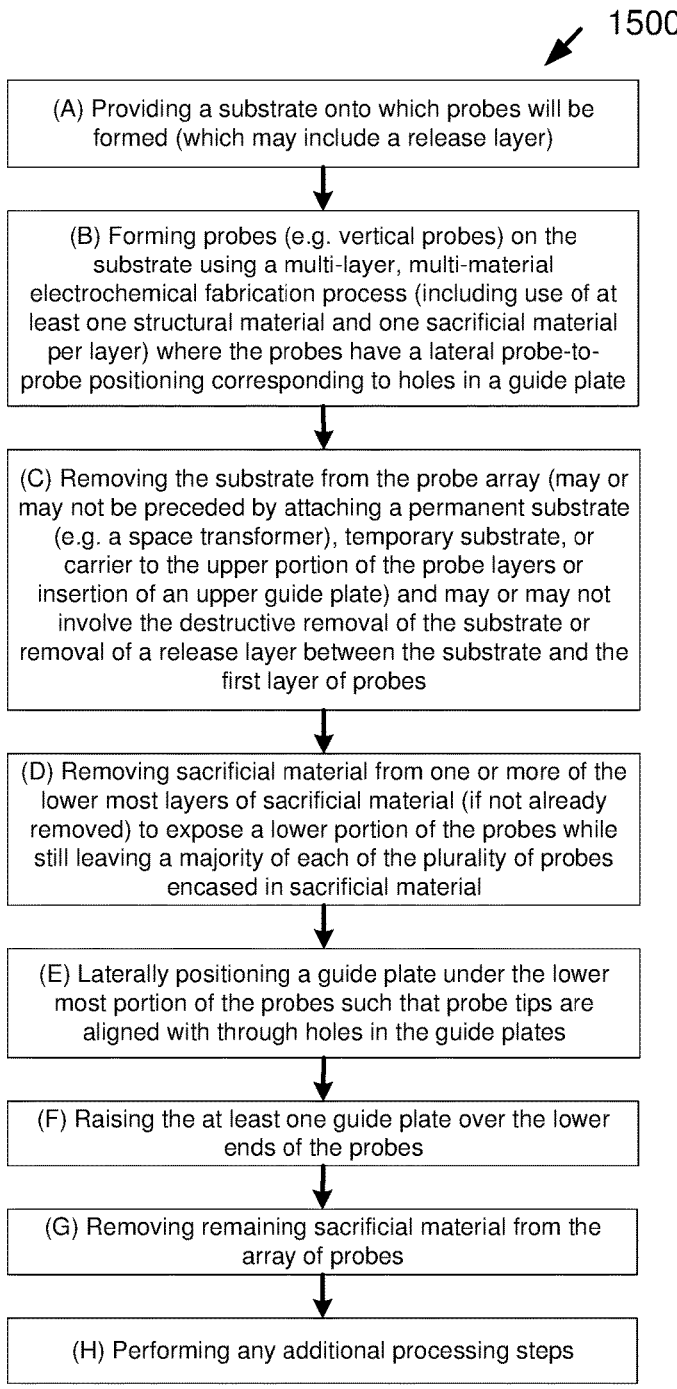
FIG. 16A
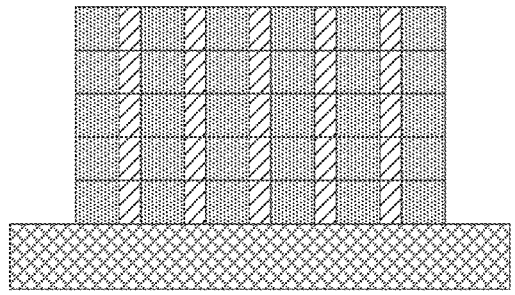
FIG. 16B
FIG. 15

Embodiment #3: : Sample illustrations of Steps 15(C) - 15(D)

Removal of some upper sacrificial material

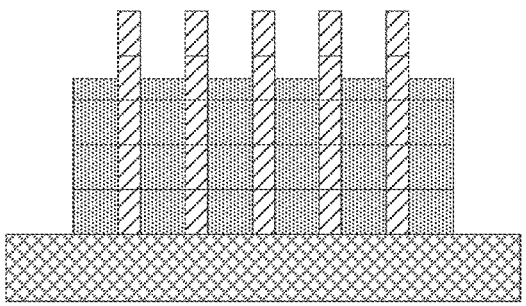

FIG. 16C-1

Longitudinal positioning of an upper guide plate

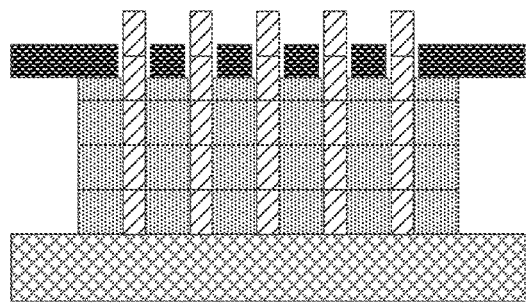

FIG. 16C-3

Lateral positioning of an upper guide plate (In this example, a single upper guide plate is provided. In alternative embodiments, multiple guide plates could be inserted and thereafter longitudinally positioned with desired longitudinal spacing)

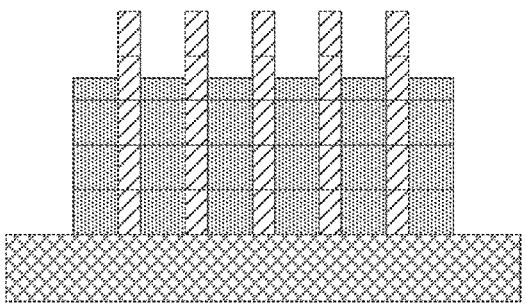

FIG. 16C-2

Substrate removed

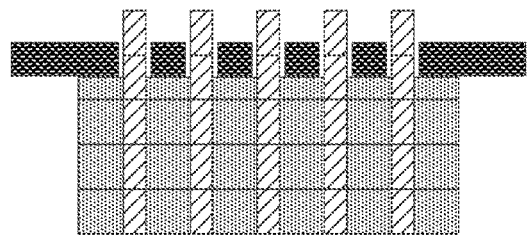

FIG. 16C-4

Removing sacrificial material from lower portions of the probe

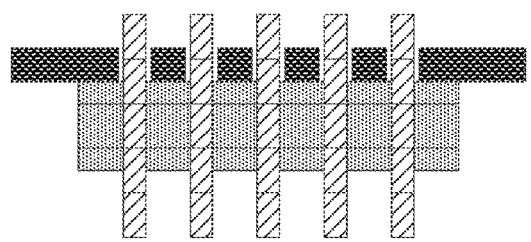

FIG. 16D

Embodiment #3: Sample illustrations of Steps 15(E) - 15(H)

Lateral positioning of a lower guide plate
(In this example, a single lower guide plate
is provided. In alternative embodiments,
multiple guide plates could be inserted and
thereafter longitudinally positioned with
desired longitudinal spacing)

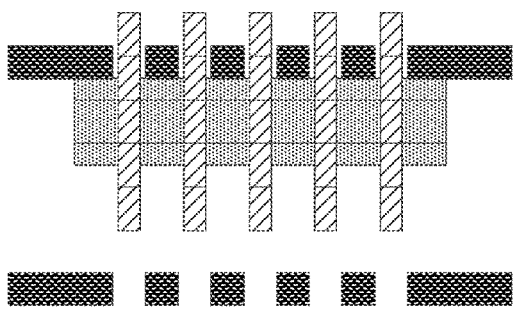

FIG. 16E

Removal of sacrificial material and
possibly performing other operations (like
heat treating)

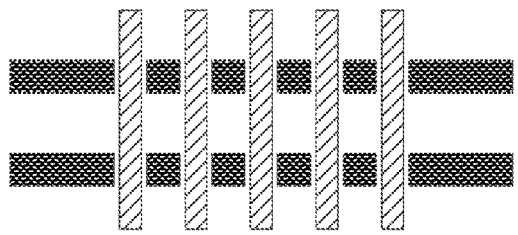

FIG. 16G

The lower guide plate is longitudinally
positioned

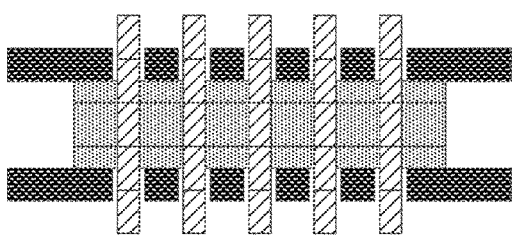

FIG. 16F

Optional lateral offsetting of guide plates

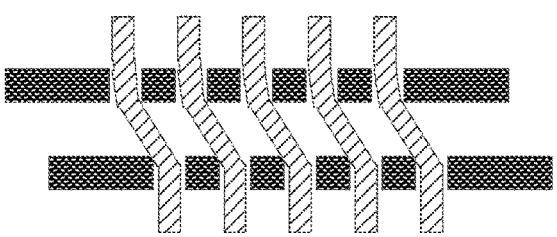

FIG. 16H

Embodiment #4: Sample illustrations of Steps 17(A) - 17(E)

FIG. 18A

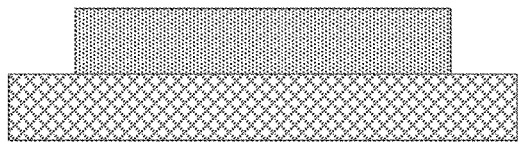

FIG. 18B

Holes are formed in a layer of masking material.

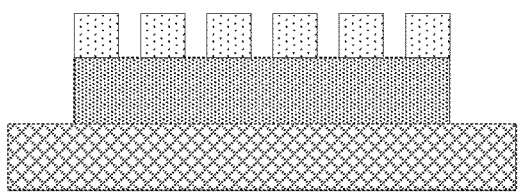

FIG. 18C

A guide plate with coated through holes is added.

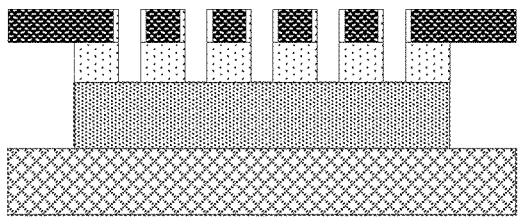

FIG. 18D

A patterned masking material is formed over the guide plate (in some alternative embodiments, the patterning of all layers of masking material could have occurred simultaneously).

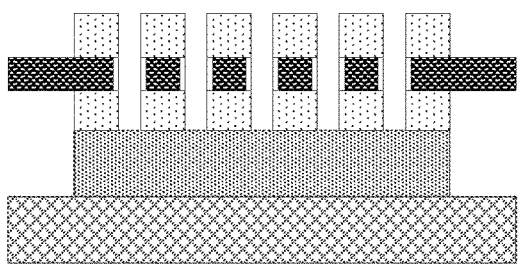

FIG. 18E-1

Probe/tip material is deposited.

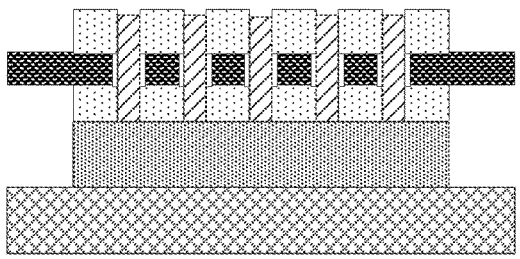

FIG. 18E-2

Masking material is removed.

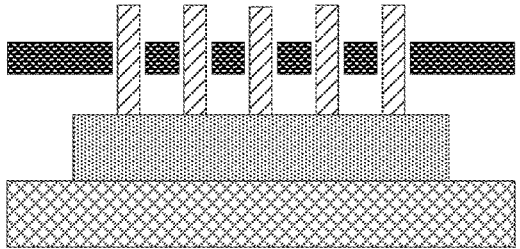

FIG. 18E-3

Sacrificial material is deposited.

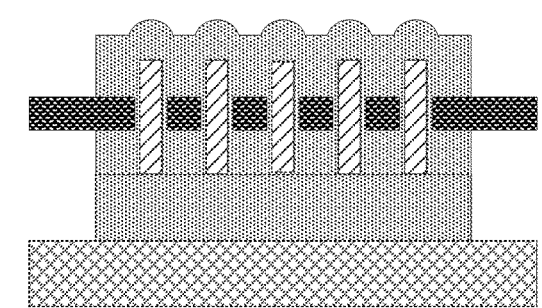

FIG. 18E-4

The structural and the sacrificial materials are planarized.

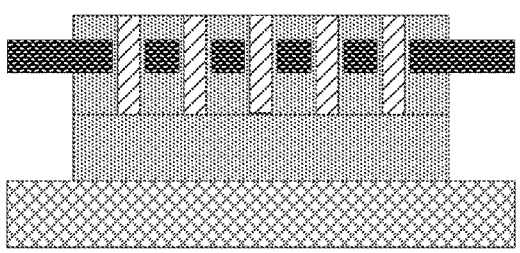

FIG. 18E-5

Embodiment #4: Sample illustrations of Steps 17(F) - 17(H)

Layers are formed with sacrificial material (different from a masking material) on lower layers and masking material retained on last layer.

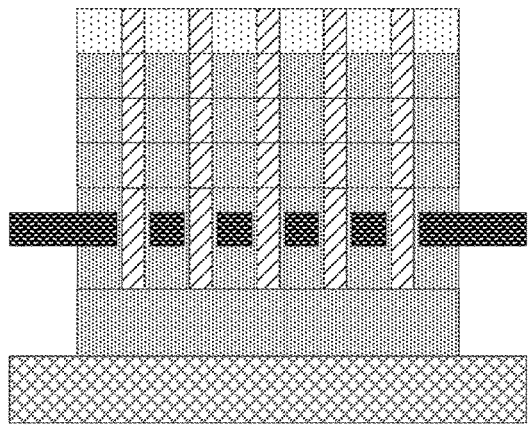

FIG. 18F

Removal of the masking material from the last layer

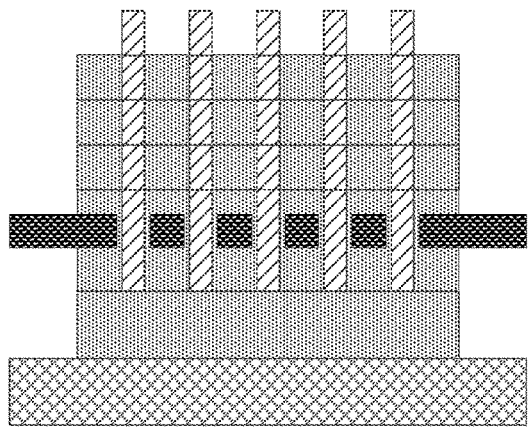

FIG. 18G-1

A second guide plate has been laterally and longitudinally positioned.

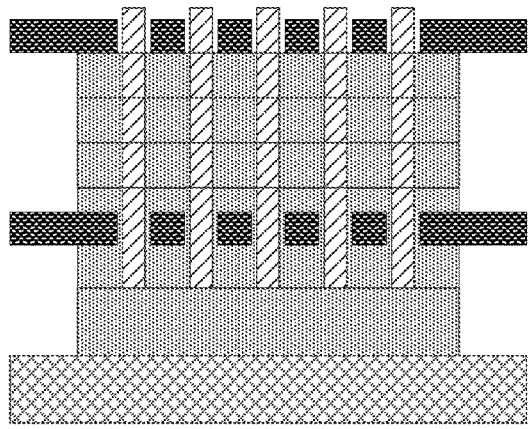

FIG. 18G-2

The substrate and sacrificial material have been removed and possible other processing steps performed (such as heat treating).

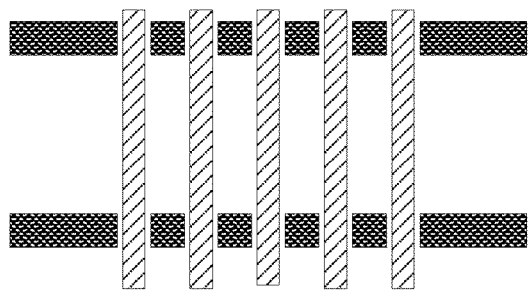

FIG. 18G-3

Guide plates are optionally laterally offset.

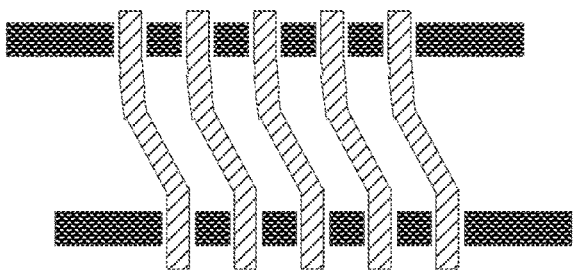

FIG. 18H

Embodiment #5: Sample illustrations of Steps 19(A) - 19(F)
FIG. 20A
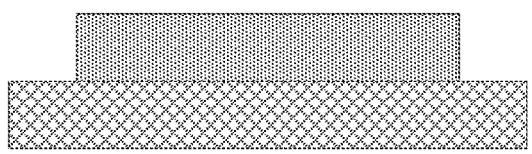
FIG. 20B
Layers formed with sacrificial material
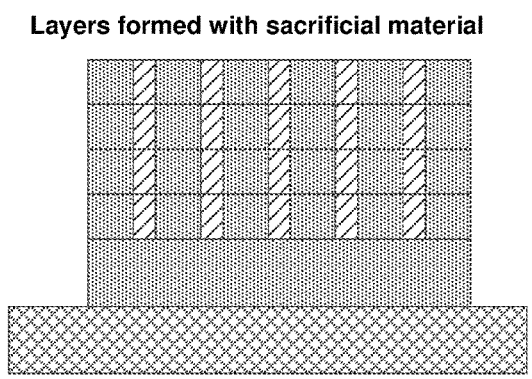
FIG. 20C
Removal of some upper sacrificial material
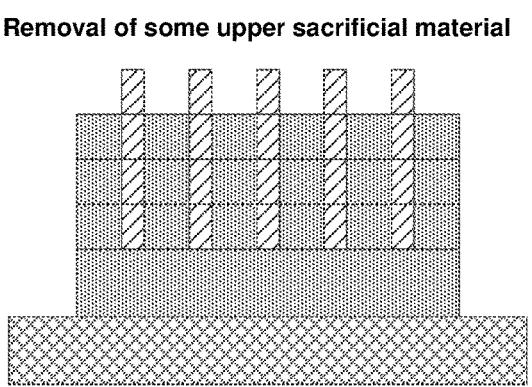
FIG. 20D
Lateral positioning of an upper guide plate
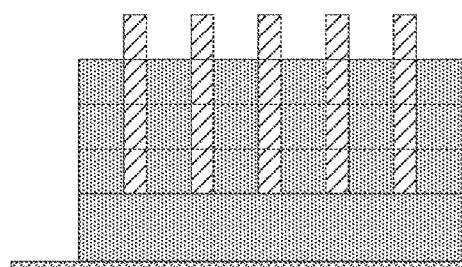
FIG. 20E
Longitudinal positioning of an upper guide plate
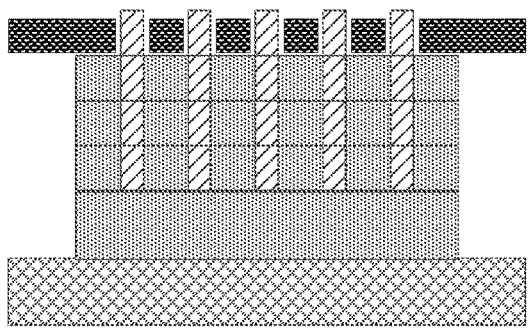
FIG. 20F

Embodiment #5: Sample illustrations of Illustration of Steps 19(G) - 19(J)

Deposit a sacrificial material (including a seed layer if necessary).

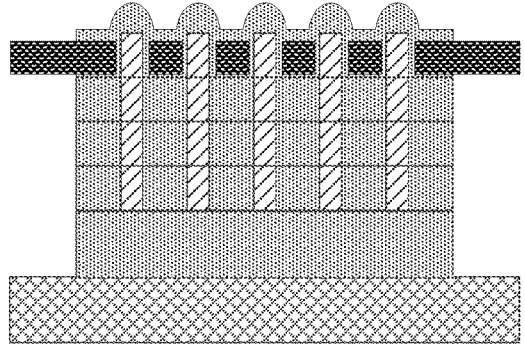

FIG. 20G-1

Planarize the sacrificial and structural materials.

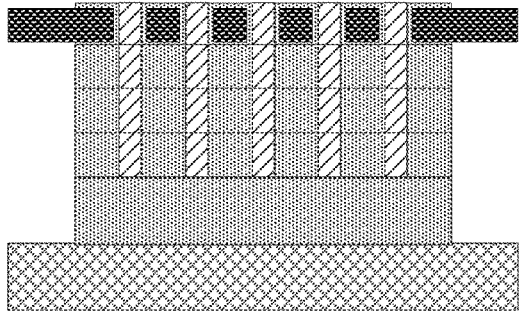

FIG. 20G-2

Form one or more additional layers to complete the probes.

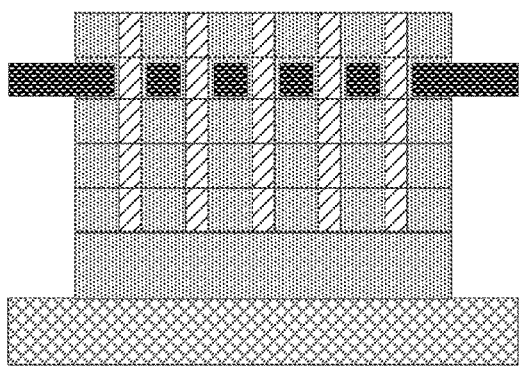

FIG. 20G-3

Remove the substrate but retain at least a portion of the sacrificial material (e.g. to to hold the probes together).

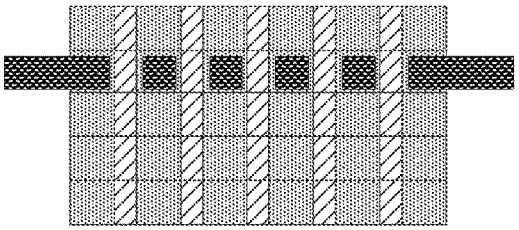

FIG. 20H-1

Optional Step: Remove sacrificial material from the bottom of the probes, and laterally and longitudinally position a lower guide plate.

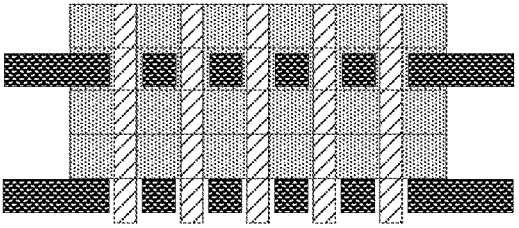

FIG. 20H-2

Remove sacrificial material and possibly performing other operations like heat treating.

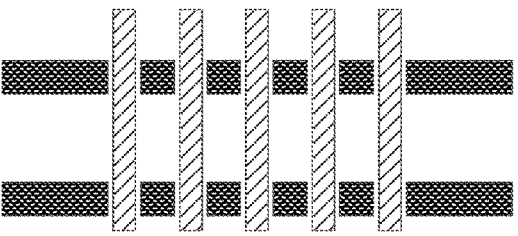

FIG. 20I

Laterally offset the guide plates (and lock them into place – not shown).

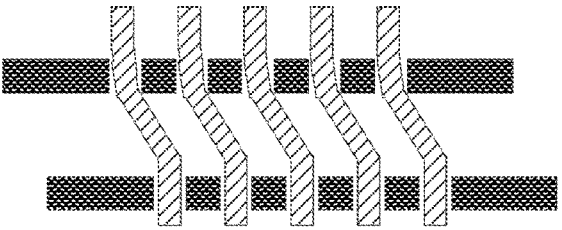

FIG. 20J

Embodiment #6: Sample illustrations of Steps 21(A) - 21(H)

FIG. 22A

Layers formed with sacrificial material on lower layers and masking material (e.g. photoresist) remaining on the last formed layer

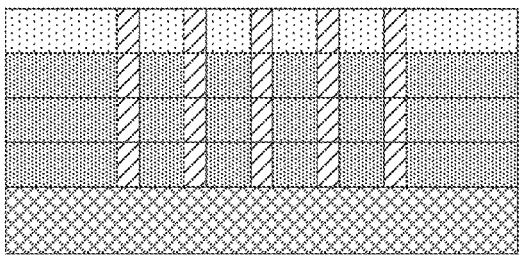

FIG. 22B

Remove masking material.

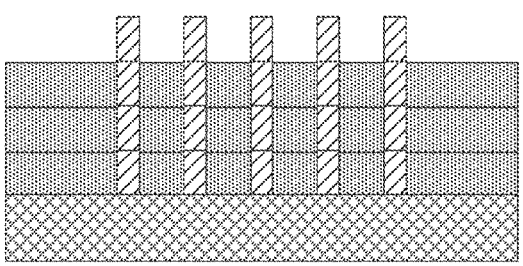

FIG. 22C

Form coatings over the exposed probe ends.

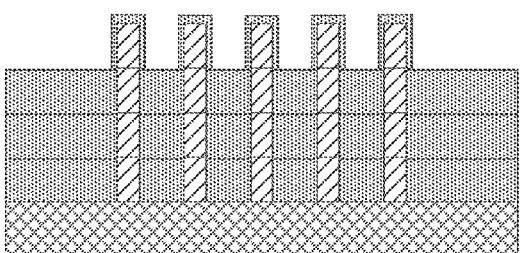

FIG. 22D

Form a guide plate including locating and infiltration and/or solidification.

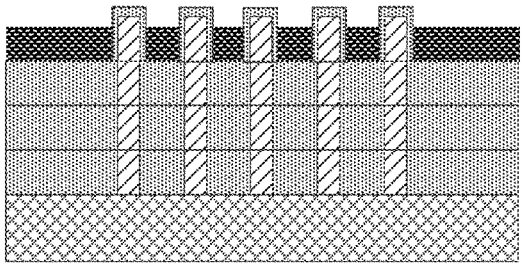

FIG. 22E

Remove the coating material.

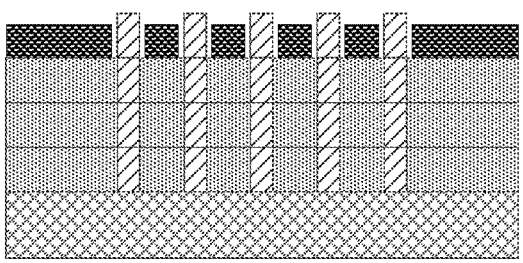

FIG. 22F

Form additional layers as needed (None needed in this example).

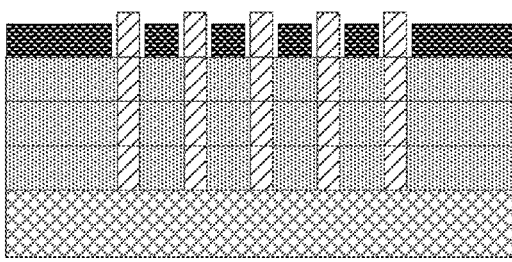

FIG. 22G

Sacrificial material was removed and guide plate and substrate were optionally laterally shifted.

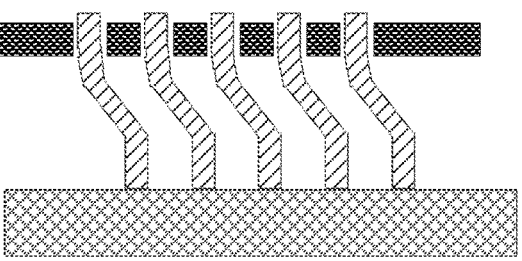

FIG. 22H

Embodiment #7: Sample illustrations of Steps 23(A) - 23(F)

FIG. 24A

Multi-material layers formed with sacrificial material on lower layers and masking material (e.g. photoresist) remaining on the last formed layer

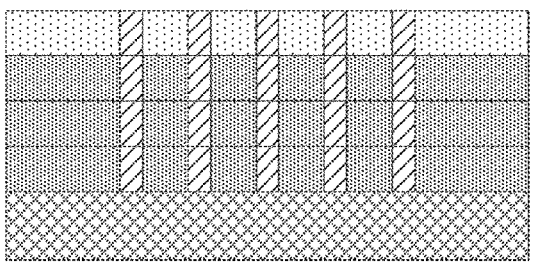

FIG. 24B

Form the guide plate with openings created by pre-patterned masking material.

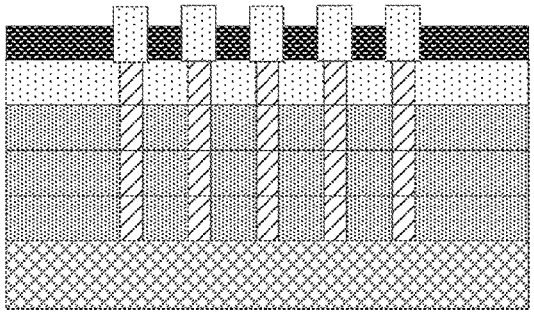

FIG. 24C

Remove the masking material in the through holes and below the guide plate.

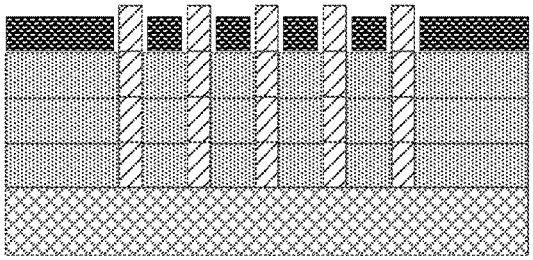

FIG. 24D

Form additional layers as needed (None needed in this example).

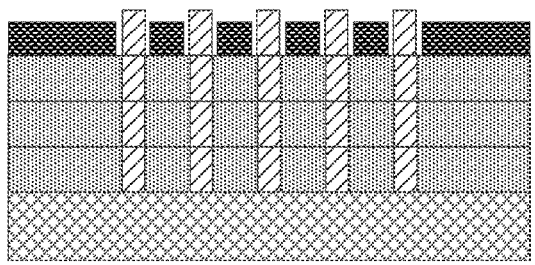

FIG. 24E

Remove sacrificial material and optionally relatively shift the guide plate and substrate and lock them into position (locking is not shown).

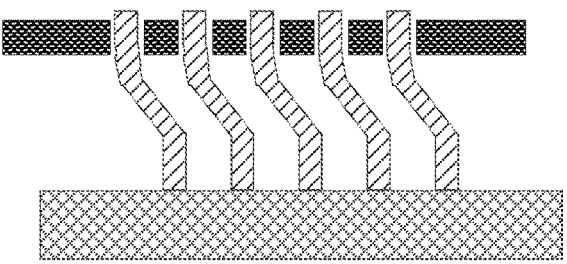

FIG. 24F

BUCKLING BEAM PROBE ARRAYS AND METHODS FOR MAKING SUCH ARRAYS INCLUDING FORMING PROBES WITH LATERAL POSITIONS MATCHING GUIDE PLATE HOLE POSITIONS

RELATED APPLICATIONS

The below table sets forth the priority claims for the instant application along with filing dates, patent numbers, and issue dates as appropriate. Each of the listed applications is incorporated herein by reference as if set forth in full herein including any appendices attached thereto.

| App. No. | Continuity Type | App. No. | Which was Filed | Which is now | Which issued on |
|---|---|---|---|---|---|
| This application | claims benefit of | 63/015,450 | 2020 Apr. 24 | — | — |

FIELD OF THE INVENTION

The present invention relates generally to the field of buckling beam probe arrays or subarrays for testing (e.g. wafer level testing or socket testing) of electronic components (e.g. integrated circuits), more particularly formation of such arrays or subarrays including vertical MEMS probes fabricated with probe-to-probe lateral positions matching guide plate through hole positions.

BACKGROUND OF THE INVENTION

Probes:

Numerous electrical contact probe and pin configurations as well as array formation methods have been commercially used or proposed, some of which may be prior art while others are not. Examples of such pins, probes, arrays, and methods of making are set forth in the following patent applications, publications of applications, and patents. Each of these applications, publications, and patents is incorporated herein by reference as if set forth in full herein.

| U.S. Pat App No., Filing Date U.S. App Pub No., Pub Date U.S. Patent No., Pub Date | First Named Inventor, "Title" |
|---|---|
| 10/772,943 - Feb. 4, 2004 2005-0104609 - May 19, 2005 — | Arat, et al., "Electrochemically Fabricated Microprobes" |
| 10/949,738 - Sep. 24, 2004 2006-0006888 - Jan. 12, 2006 — | Kruglick, etal., "Electrochemically Fabricated Microprobes" |
| 11/028,945 - Jan. 3, 2005 2005-0223543 - Oct. 13, 2005 7,640,651 - Jan. 5, 2010 | Cohen, et al., "A Fabrication Process for Co-Fabricating a Multilayer Probe Array and a Space Transformer" |
| 11/028,960 - Jan 3, 2005 2005-0179458 - Aug. 18, 2005 7,265,565 - Sep. 4, 2007 | Chen, et al. "Cantilever Microprobes for Contacting Electronic Components and Methods for Making Such Probes" |
| 11/029,180 - Jan. 3, 2005 2005-0184748 - Aug. 25, 2005 | Chen, et al. "Pin-Type Probes for Contacting Electronic Circuits and Methods for Making Such Probes" |
| 11/029,217 - Jan. 3, 2005 2005-0221644 - Oct. 6, 2005 7,412,767 - Aug. 19, 2008 | Kim, et al., "Microprobe Tips and Methods for Making" |
| 11/173,241 - Jun. 30, 2005 2006-0108678 - May 25, 2006 | Kumar, et al., Probe Arrays and Method for Making |
| 11/178,145 - Jul. 7, 2005 2006-0112550 - Jun. 1,2006 7,273,812 - Sep. 25, 2007 | Kim, et al., "Microprobe Tips and Methods for Making" |
| 11/325,404 - Jan. 3, 2006 2006-0238209 - Oct. 26, 2006 — | Chen, etal., "Electrochemically Fabricated Microprobes" |
| 14/986,500 - Dec. 31, 2015 2016-0231356 - Aug. 11,2016 10,215,775 - Feb. 26, 2019 | Wu, etal. "Multi-Layer, Multi-Material Micro-Scale and Millimeter-Scale Devices with Enhanced Electrical and/or Mechanical Properties" |
| 16/172,354 - Oct. 18, 2018 2019-0204354 - Jul. 4, 2019 10,877,067 - Dec. 29, 2020 | Chen, et al. "Pin-Type Probes for Contacting Electronic Circuits and Methods for Making Such Probes" |
| 16/584,818 - Sep. 26, 2019 — 11,262,383 - Mar. 1, 2022 | Smalley, "Probes Having Improved Mechanical and/or Electrical Properties for Making Contact between Electronic Circuit Elements and Methods for Making" |
| 16/584,863 - Sep. 26, 2019 — — | Frodis, "Probes Having Improved Mechanical and/or Electrical Properties for Making Contact between Electronic Circuit Elements and Methods for Making" |
| 17/139,933 - Dec. 31, 2020 — — | Wu, "Compliant Pin Probes with Multiple Spring Segments and Compression Spring Deflection Stabilization Structures, Methods for Making, and Methods for Using" |
| 17/139,936 - Jan. 15, 2020 — — | Wu, "Probes with Multiple Springs, Methods for Making, and Methods for Using" |
| 17/139,940 - Dec. 31, 2020 — — | Wu, "Compliant Pin Probes with Flat Extension Springs, Methods for Making, and Methods for Using" |

| U.S. Pat App No., Filing Date U.S. App Pub No., Pub Date U.S. Patent No., Pub Date | First Named Inventor, "Title" |
|---|---|
| 17/139,925 - Dec. 31, 2020 — — | Veeramani, "Probes with Planar Unbiased Spring Elements for Electronic Component Contact and Methods for Making Such Probes" |

Electrochemical Fabrication:

Electrochemical fabrication techniques for forming three-dimensional structures from a plurality of adhered layers have been, and are being, commercially pursued by Microfabrica® Inc. (formerly MEMGen Corporation) of Van Nuys, California under the process names EFAB and MICA FREEFORM®.

Various electrochemical fabrication techniques were described in U.S. Pat. No. 6,027,630, issued on Feb. 22, 2000 to Adam Cohen.

A related method for forming microstructures using electrochemical fabrication techniques is taught in U.S. Pat. No. 5,190,637 to Henry Guckel, entitled "Formation of Microstructures by Multiple Level Deep X-ray Lithography with Sacrificial Metal Layers".

FIGS. 1A-1I illustrate side views of various states in an example multi-layer, multi-material electrochemical fabrication process. FIGS. 1A-1G illustrate various stages in the formation of a single layer of a multi-layer fabrication process where a second metal is deposited on a first metal as well as in openings in the first metal so that the first and second metals form part of the layer. In FIG. 1A, a side view of a substrate 182 having a surface 188 is shown, onto which patternable photoresist 184 is deposited, spread, or cast as shown in FIG. 1B. In FIG. 1C, a pattern of resist is shown that results from the curing, exposing, and developing of the resist. The patterning of the photoresist 184 results in openings or apertures 192(a)-192(c) extending from a surface 186 of the photoresist through the thickness of the photoresist to surface 188 of the substrate 182. In FIG. 1D, a metal 194 (e.g. nickel) is shown as having been electroplated into the openings 192(a)-192(c). In FIG. 1E, the photoresist has been removed (i.e. chemically stripped) from the substrate to expose regions of the substrate 182 which are not covered with the first metal 194. In FIG. 1F, a second metal 196 (e.g. silver) is shown as having been blanket electroplated over the entire exposed portions of the substrate 182 (which is conductive) and over the first metal 194 (which is also conductive). FIG. 1G depicts the completed first layer of the structure which has resulted from the planarization of the first and second metals down to a height that exposes the first metal and sets a thickness for the first layer. In FIG. 1H, the result of repeating the process steps shown in FIGS. 1B-1G several times to form a multi-layer structure is shown where each layer consists of two materials. For most applications, one of these materials is removed as shown in FIG. 1I to yield a desired 3-D structure 198 (e.g. component or device).

Other methods for forming three-dimensional structures were described in U.S. patent application Ser. Nos. 10/272,255, 10/272,254, and 10/271,574, now respectively U.S. Pat. Nos. 7,163,614, 7,172,684, and 7,288,178. These patents describe electrochemical extrusion (or ELEX) methods that may be used to form elongated structures with vertical, curved, or even stair-stepped configurations.

A first example of such an ELEX method is illustrated in FIGS. 2A-2F (i.e. FIGS. 5A-5F of the '178 patent) wherein a relatively thin mask (i.e. much thinner than the masks used in LIGA) is provided that can be moved independently of the substrate during deposition of material so as to form a structure by what may be considered electrochemical extrusion. FIG. 2A illustrates a mask 202 that includes a support portion 204 (e.g. a rigid or dimensionally stable structure) and a conformable portion 206, an electrode 208 that may function as an anode, a substrate 210, and a bellows 220 and bellows chamber 212 that are located within a deposition tank 214 that can hold an electrolyte 216 (shown in FIG. 2B). The open side of the bellows 220 connects to and seals with a perimeter region of the mask 202. This sealing makes the openings through the mask the only paths between the inside and outside of the bellows. Next, as shown in FIG. 2B, the substrate 210 and the mask 202 are pressed against each other, and the tank 214 is filled with electrolyte 216 in such a manner that the electrolyte does not become located in the region 212 between the substrate and the bellows. As shown in FIG. 2C, a potential is applied between the anode 208 and the substrate 210 (which acts as a cathode) via power source 222 and wires 224 and 226. The potential is supplied with a polarity and current that allows a deposition 238 to begin forming on the substrate at an appropriate rate. The primary source of the deposition material is preferably the anode 208 with potentially some deposition material being supplied directly by the electrolyte.

After the deposition thickens to a desired height, the substrate and the mask begin to separate at a desired rate. The average rate of separation is preferably approximately equal to the average rate of deposition such that a deposition zone and a location on the mask surface stay in the same approximate position throughout the deposition operation with the exception of the initial portion of the deposition that occurs before movement begins. During separation, the sidewalls 232 of the mask seal with the sidewalls 234 of the growing deposit 238 such that the electrolyte does not enter the bellows chamber 212. In one embodiment, the deposition rate and the movement occur in such a manner that the position of the deposition stays at a position 240 relative to the face surface 236 of the mask resulting in a separation of "L". In other embodiments though, the average deposition rate and the separation rate are approximately equal, and actual separation may occur in discrete and discontinuous steps while the deposition may occur in a continuous manner or in a discontinuous manner. Deposition and movement may occur in an alternating manner at different times. In some embodiments, the working surface may extend into the support region of the mask.

FIG. 2D depicts the state of deposition after the deposit thickness has grown to several times the thickness of the original mask and even more times the thickness of the conformable material portion 206 of the mask. FIG. 2E depicts the state of the process after the deposit 238 has grown to become the completed structure 242. FIG. 2F depicts the combined substrate 210 and structure 242 after being removed from the apparatus of FIGS. 2A-2E.

A second example of an ELEX method is set forth in FIG. 3 (i.e. FIG. 6 of the '178 patent) which illustrates a side view of a structure 342 formed by electrochemical extrusion of material onto substrate 310 via mask 302. During the formation of the structure 342, not only was there a perpendicular separation of the planes of the mask 302 and substrate 310 surfaces but there was also motion that had a component parallel to the planes of the mask and substrate surfaces. The parallel component of motion may include translational motion or may include rotational motion around an axis that has a component that is perpendicular to a plane of the mask surface (i.e. the face of the conformable material) or of a contact face of the substrate surface.

Electrochemical fabrication provides the ability to form prototypes and commercial quantities of miniature objects, parts, structures, devices, and the like, at reasonable costs and in reasonable times. In fact, electrochemical fabrication is an enabler for the formation of many structures that were hitherto impossible to produce. Electrochemical fabrication opens the spectrum for new designs and products in many industrial fields. Even though electrochemical fabrication offers this new capability and it is understood that electrochemical fabrication techniques can be combined with designs and structures known within various fields to produce new structures, certain uses for electrochemical fabrication provide designs, structures, capabilities and/or features not known or obvious in view of the state of the art.

A need exists in various fields for miniature devices having improved characteristics, improved operational capabilities, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is a first object of some embodiments of the invention to provide an improved method of forming buckling beam probe arrays with MEMS probes that are built up with lateral positions of probes, at one or more longitudinal heights, corresponding to through holes associated with guide plates that may be engaged with the probes during formation of the probes or after formation of the probes.

It is a second object of some embodiments of the invention to provide one or more guide plates directly or indirectly on a build substrate and thereafter to form an array of probes in lateral alignment with the one or more guide plates wherein: (1) one longitudinal end of each of the probes extends into, or possibly completely through, the holes in the one or more guide plates when those ends are formed, or (2) the probes do not extend into the holes in the one or more guide plates upon formation but extend into the holes after at least partial or complete formation of the probes (e.g. upon removal of a portion of a material that holds the probes in their relative lateral positions which could be followed by relative movement of the guide plate with respect to a local longitudinal axis of the probes or a longitudinal axis of the probe array as a whole).

It is an object of some embodiments of the invention to laterally align one or more guide plates and MEMS probes after only partial longitudinal formation of the probes in an array configuration; and then after such lateral alignment, finishing the longitudinal formation of the probes wherein: (1) a portion of a masking or sacrificial material is removed after the lateral alignment of the one or more guide plates to the probes which in turn allows the one or more guide plates to be moved longitudinally so that probes extend at least partially into the through holes, if not completely through the holes, of the one or more guide plates, and thereafter continuing longitudinal formation of the probes, or (2) prior to laterally aligning the partially formed probes and the one or more guide plates, exposing the ends of the probes so that they may be engaged with one or more guide plates, and then laterally and longitudinally aligning the probes and the guide plates such that the ends of the partially formed probes extend at least part way into the holes, if not completely through holes, and thereafter continuing longitudinal formation of the probes.

It is an object of some embodiments of the invention to laterally and longitudinally align one or more guide plates with a plurality of completed MEMS probes that were formed together with positions corresponding to holes existing in guide plates or that will be made to exist in guide plates wherein: (1) a portion of a masking or sacrificial material is removed after the lateral alignment of the one or more guide plates to the probes which in turn allows the one or more guide plates to be relatively moved longitudinally so that probes extend at least partially into the through holes, after which, if necessary, further removal of masking or sacrificial material may occur to allow further longitudinal engagement of probes with the one or more guide plates, or (2) prior to laterally aligning the formed probes and the one or more guide plates, exposing the ends of the probes so that they may be engaged with one or more guide plates, and then laterally and longitudinally aligning the probes and the guide plates such that the ends of the probes extend at least part way into the holes, if not completely through holes, and thereafter, if necessary, continuing the removal of masking or sacrificial material to allow further longitudinal engagement of the probes with the one or more guide plates.

It is an object of some embodiments of the invention to form one or more guide plates while in lateral alignment with probe arrays where: (1) one or more guide plates are formed directly or indirectly on a probe substrate prior to the formation of the probes, (2) one or more guide plates are formed in lateral alignment with partially formed probes and are then moved longitudinally such that ends of the partially formed probes at least partially extend into the through holes of the one or more guide plates, (3) one or more guide plates are formed in lateral alignment and longitudinal alignment with the partially formed probes such that the ends of the partially formed probes at least partially extend into the through holes of the one or more guide plates, (4) one or more guide plates are formed in lateral alignment with completed probes and are then moved longitudinally such that ends of the formed probes extend through the through holes of the one or more guide plates, or (5) one or more guide plates are formed in lateral alignment and longitudinal alignment with the completed probes such that the ends of the partially formed probes extend through the through holes of the one or more guide plates as the guide plates are formed.

It is an object of some embodiments of the invention to form one or more guide plates while in lateral alignment with probe arrays where the formation of the one or more guide plates includes: (1) locating a plate of material relative to the probes and then forming through holes in the plate in lateral alignment with the locations of the probes in the probe array, (2) providing coating over the end of completed or partially formed probes to provide a temporary expansion of probe cross-section in the longitudinal position of the probes where guide plate formation is to occur, locating at least one guide plate material in depositable, flowable, spreadable, or sprayable form around at least part of the expanded cross-sectional portions of the probes; solidifying the guide plate material if not solidified upon deposition; and possibly planarizing the guide plate material before or after solidification, or (3) at a longitudinal level not occupied by probes or partially formed probes, locating a masking material in locations where through holes of a guide plate are to exist; locating at least one guide plate material in depositable, flowable, spreadable, or sprayable form around the sides of the masking material; solidifying the guide plate material if not solidified upon deposition; and possibly planarizing the guide plate material before or after solidification and thereafter removing the masking material and positioning the guide plate longitudinally to engage the partially, or completely, formed probes.

It is an object of some embodiments of the invention to provide improved methods of simultaneously engaging a plurality of partially formed or fully formed probes with one or more guide plates having through holes set in an intended array configuration.

It is an object of some embodiments of the invention to ensure that completely formed probes or partially formed probes are in an intended array configuration at the time of engaging one or more guide plates having that configuration.

It is an object of some embodiments of the invention to provide probe arrays having (1) at least one substrate to which a plurality of probes are bonded and at least one guide plate through which the plurality of probes extend and which together define an array configuration for the probes, or (2) at least a plurality of guide plates through which a plurality of probes extend to set an array configuration for the plurality of probes; and wherein the probes and the at least one guide plate have an interface that provides both lateral positioning of the probes and controlled longitudinal movement of the probes in at least one direction and, in some cases, in both directions.

It is an object of some embodiments of the invention to provide probe arrays having (1) at least one substrate to which a plurality of probes are bonded and at least one guide plate through which the plurality of probes extend and which together define an array configuration for the probes, or (2) at least a plurality of guide plates through which a plurality of probes extend to set an array configuration for the plurality of probes, wherein the probes extend, at least in part, longitudinally in a direction of layer stacking and wherein interfaces between the probes and the one or more guide plates are configured so that no layer-to-layer offset, or variation in layer-to-layer configuration unintentionally inhibits smooth motion of the probes through the one or more guide plates over a working range of motion where (1) the multi-layer probe is configured to have no layer boundary that would move past the edge of a guide plate over a working range of motion; or (2) the multi-layer probe has no layer boundary that moves past an edge of the guide plate where a lateral step in motion would occur (e.g. any portion moving from inside the hole to outside the hole would not have any significant step or the step would be inward so that the portion would not contact the guide plate when moving longitudinally in and out).

It is an object of some embodiments of the invention to provide lateral alignment and then simultaneous and longitudinal engagement of at least one guide plate with a plurality of MEMS probes or partially formed MEMS probes, where the probes are formed in a lateral array configuration, and thereafter, if required, causing a lateral movement of at least one guide plate with respect to another guide plate or with respect to a substrate so as to provide a desired lateral shifting of opposite ends of the probes compared to their initial positions, and then fixing or retaining the guide plate or plates and/or substrate in final lateral configurations.

It is an object of some embodiments of the invention to reduce errors in probe placement prior to engaging probes and guide plates.

It is an object of some embodiments of the invention to reduce the time and/or effort of producing buckling beam probe arrays.

It is an object of some embodiments of the invention to reduce the cost of production of forming buckling beam probe arrays or probe heads.

It is an object of some embodiments of the invention to provide improved methods of fabricating probe arrays. Some such methods may include use of only (i.e. be limited to) multi-layer, multi-material electrochemical fabrication methods that fabricate the entire probe arrays in fully configured states. Other methods may combine separately formed arrays (or subarrays) laterally with other arrays (or subarrays) to formed large tiled arrays where lateral subarray combining may occur after sacrificial material release prior to sacrificial material release, before or after lateral shifting of guide plates relative to other guide plates or substrates. Other methods may include in situ steps or operations or post layer steps or operations that provide for conformable coating of specialized materials over probe elements, selected portions of probes or entire probes (e.g. dielectrics for isolation of probes from one another, dielectrics for electrical isolation of a portion of one probe from another portion of the same probe, e.g. for coaxial configurations, contact materials, bonding materials, adhesion enhancement materials, barrier materials, and the like). Other methods may include formation of intentionally extended single layer contact surfaces that allow uninhibited movement of slidable probe components even in the presence of unintended layer features (e.g. layer-to-layer offsets or non-perpendicular intra-layer wall configurations). Still other methods may include setting probe orientation relative to layer planes and layer stacking directions to allow optimal creation of probe and array features. Other steps or operations may be provided or features formed in probes, probe arrays, or guide plates that provide features of opposed slidable, or otherwise movable, probe elements in build locations that allow minimum feature size gaps to exist which are larger than gaps desired when the probes are in operational configurations along with formation of spring loaded stops, snap-together features, or other structures that allow enforcement of working locations or working regions that are distinct from build locations.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not intended that all objects, or even multiple objects, be addressed by any single aspect or embodiment of the invention even though that may be the case regarding some aspects.

In a first set of aspects, steps, functionalities, or features as set forth in the generalized embodiments, alternative implementations of those generalized embodiments, the specific embodiments, or alternative implementations of those specific embodiments are included.

In a second set of aspects of the invention, a method of forming a probe array having at least one guide plate includes the steps, functionality, and/or features noted in the above objects of the invention as (1) individually set forth, (2) set forth in separate alternatives noted with regard to some objectives, or (3) set forth in a combination of such objectives or separate alternatives for those objectives, so long as the combination does not completely remove all the benefits offered by each of the separate objectives or alternatives.

In a third set of aspects, a probe array is provided that has at least one guide plate and includes the functionality or features noted in the above objects of the invention as (1) individually set forth, (2) set forth in separate alternatives noted with regard to some objectives, or (3) set forth in a combination of such objectives or separate alternatives for those objectives, so long as the combination does not completely remove all the benefits offered by each of the separate objectives or alternatives.

In a fourth set of aspects, subcombinations of steps, functionalities, or features as set forth in the generalized embodiments, alternative implementations of those generalized embodiments, the specific embodiments, or alternative implementations of those specific embodiments are included in a combination or subcombination in any functional manner to achieve one of the objectives noted herein, or as ascertained from the teachings herein (directly set forth or set forth by incorporation).

In another aspect of the invention, a method of forming a two-dimensional probe array, includes: (A) forming a plurality of probes on a substrate with each probe having two ends, and at least one intermediate elastically compliant portion, wherein at least one of the ends being configured as a contact end for making electric contact to a second electrical circuit element while the other end is selected from the group consisting of: (1) a contact end for making pressure based contact to a first electric element, and (2) an attachment end for making a fixed contact to the first circuit element, wherein the probes are formed with probe-to-probe spacings corresponding to contacts on the second circuit element, wherein the formation of the plurality of probes, includes: (i) forming one or more multi-material layers, with any successively formed multi-material layers adhered to a previously formed multi-material layer or a non-multi-material layer that in turn was adhered directly or indirect to a previously formed multi-material layer, and with each multi-material layer comprising at least two materials, at least one of which is at least one structural material and at least one other of which is at least one sacrificial material, wherein each multi-material layer defines a cross-section of the plurality of probes, wherein the forming of each multi-material layer includes: (a) depositing at least a first of the at least two materials; (b) depositing at least a second of the at least two materials; (c) planarizing at least two of the at least two deposited materials, including planarizing at least one structural material and at least one sacrificial material; (ii) after formation of all layers of the probes, separating the probes from any sacrificial material that was not removed during the formation of the one or more multi-material layers; (B) providing at least one array guide plate having a plurality of openings, and engaging the openings of the at least one guide plate around the probes at a longitudinal level, wherein the providing and the engaging of the probes and the at least one guide plate and the probes is selected from the group consisting of: (i) after forming the probes to have a full length, positioning a guide plate laterally and longitudinally over and around ends of the probes, with an end of the probes extending from unremoved sacrificial material by an amount selected from the group consisting of: (a) less than a lateral dimension of an individual probe; (b) less than a lateral dimension of a spacing between adjacent probes; (c) less than a fraction of a height of a probe where the fraction is selected from the group consisting of (1) 1/2, (2) 1/3, (3) 1/4, (4) 1/5, (5) 1/10, and (6) 1/20; (d) less than N thicknesses of the guide plate, wherein N is selected from the group consisting of (1) 4, (2) 3, (3) 2, (4) 1, (5) 1/2, (6) 1/3, and (7) 1/4; and (e) less than an amount selected from the group consisting of 500 microns, 200 microns, 100 microns, 50, microns, 20 microns, 10 microns, and 5 microns; (ii) after forming the probes to have only a partial length, positioning a guide plate laterally and longitudinally over and around the ends of the partial length probes, then completing formation of the length of the probes, wherein at the time of positioning of the guide plate, an end of the probes extends from unremoved sacrificial material by an amount selected from the group consisting of: (a) less than a lateral dimension of an individual probe; (b) less than a lateral dimension of a spacing between adjacent probes; (c) less than a fraction of a height of a probe where the fraction is selected from the group consisting of (1) 1/2, (2) 1/3, (3) 1/4, (4) 1/5, (5) 1/10, and (6) 1/20; (d) less than N thicknesses of the guide plate, wherein N is selected from the group consisting of (1) 4, (2) 3, (3) 2, (4) 1, (5) 1/2, (6) 1/3, and (7) 1/4; and (e) less than an amount selected from the group consisting of (1) 500 microns, (2) 200 microns (3) 100 microns, (4) 50, microns, (5) 20 microns, (6) 10 microns, and (7) 5 microns; (iii) prior to forming a first layer of the probes position the guide plate over the substrate, in direct or indirect contact therewith, and then forming the probes through openings in the guide plate; (iv) after forming the probes to have a full length, forming a guide plate with openings aligned laterally with the probes and positioned longitudinally with the openings at least partially surrounding portions of the probes; (v) after forming the probes to have a full length, forming a guide plate with openings aligned laterally with the probes and positioned longitudinally with the openings at least partially surrounding portions of the probes wherein only a longitudinal portion of the probes extend from sacrificial material at the time of guide plate formation, wherein the portion is selected from the group consisting of: (a) less than a lateral dimension of an individual probe; (b) less than a lateral dimension of a closest spacing between adjacent probes; (c) less than a fraction of a height of a probe where the fraction is selected from the group consisting of (1) 1/2, (2) 1/3, (3) 1/4, (4) 1/5, (5) 1/10, and (6) 1/20; (d) less than N thicknesses of the guide plate, wherein N is selected from the group consisting of (1) 4, (2) 3, (3) 2, (4) 1, (5) 1/2, (6) 1/3, and (7) 1/4; and (e) less than an amount selected from the group consisting of (1) 500 microns, (2) 200 microns (3) 100 microns, (4) 50, microns, (5) 20 microns, (6) 10 microns, and (7) 5 microns; (vi) after forming the probes to have only a partial length, forming a guide plate over ends of the partial length probes, then completing formation of the length of the probes, wherein at the time of positioning of the guide plate, an end of the partially formed probes extends from unremoved sacrificial material by an amount selected from the group consisting of: (a) less than a lateral dimension of an individual probe; (b) less than a lateral dimension of a spacing between adjacent probes; (c) less than a fraction of a height of a probe where the fraction is selected from the group consisting of (1) 1/2, (2) 1/3, (3) 1/4, (4) 1/5, (5) 1/10, and (6) 1/20; (d) less than N thicknesses of the guide plate, wherein N is selected from the group consisting of (1) 4, (2)

3, (3) 2, (4) 1, (5) 1/2, (6) 1/3, and (7) 1/4; and (e) less than an amount selected from the group consisting of (1) 500 microns, (2) 200 microns (3) 100 microns, (4) 50, microns, (5) 20 microns, (6) 10 microns, and (7) 5 microns; (vii) prior to forming a first layer of the probes forming the guide plate over the substrate, in direct or indirect contact therewith, and then forming the probes through openings in the guide plate; and (vii) after forming the probes to at least partial length, forming a guide plate with openings aligned laterally with the probes but longitudinally above the ends of the probes, and thereafter exposing the ends of the probes by removing a portion of the sacrificial material, and lowering the guide plate longitudinally over and around the ends of the probes.

Other aspects of the invention will be understood by those of skill in the art upon review of the teachings herein and for example may include alternatives in the configurations or processes set forth herein, decision branches noted in those processes or configurations, or partial or complete exclusion of such alternatives and/or decision branches in favor of explicitly setting forth process steps or features along with orders to be used in performing such steps or connections between such features. Some aspects may provide device counterparts to method of formation aspects, some aspects may provide method of formation counterparts to device aspects, and other aspects may provide for methods of use for the probe arrays providing herein.

BRIEF DESCRIPTION OF THE DRAWINGS:

FIG. 7A provides a block diagram setting forth a number of examples of how guide plates may be positioned relative to probes that have been formed or are being formed and alternatively how guide plates may be formed relative to probes that have been formed or are being formed.

FIGS. 8A-8J set forth a number of example probe configurations that may be used in the probe arrays of the various embodiments of the present invention.

FIG. 9 provides a block diagram setting forth a number of example probe-to-guide plate interfaces that may exist in some embodiments of the present invention.

FIGS. 10A-10H provide examples illustrating the various interfaces set forth in the block diagram of FIG. 9.

FIG. 11 provides a simplified flowchart of a first specific embodiment of the invention for forming a probe array with a guide plate inserted from above after probe formation and after partial removal of a sacrificial material.

FIGS. 12A-12G provide cut side views of example results of the steps set forth in operational blocks (A)-(G) of FIG. 11.

FIG. 13 provides a simplified flowchart of a second specific embodiment of the invention for forming a probe array with a guide plate inserted from above after probe formation but without initial removal of sacrificial material since no sacrificial material was used in the formation of one or more of the final layers of the probes.

FIGS. 14A-14F provide cut side views of example results of the steps set forth in operational blocks (A)-(F) of FIG. 13.

FIG. 15 provides a simplified flowchart of a third specific embodiment of the invention for forming a probe array with a guide plate inserted from below after probe formation.

FIGS. 16A-16H provide cut side views of example results of the steps set forth in operational blocks (A)-(H) of FIG. 15 including incorporation of a first guide plate during formation of the layers and a second guide plate from below after formation of the layers.

FIGS. 18A-18H provide cut side views of example results of the steps set forth in operational blocks (A)-(H) of FIG. 17.

FIGS. 20A-20J provide cut side views of example results of the steps set forth in operational blocks (A)-(J) of FIG. 19 wherein a second guide plate is added from below after release of the probe array from the build substrate.

FIGS. 22A-22H provide cut side views of example results of the steps set forth in operational blocks (A)-(H) of FIG. 21.

FIGS. 24A-24F provide cut side views of example results of the steps set forth in operational blocks (A)-(F) of FIG. 23.

Figure 1A:
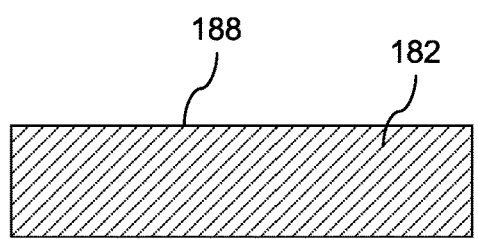
FIGS. 1A-1F schematically depict the formation of a first layer of a structure using adhered mask plating where the blanket deposition of a second material overlays both the openings between deposition locations of a first material and the first material itself.
Figure 1B:
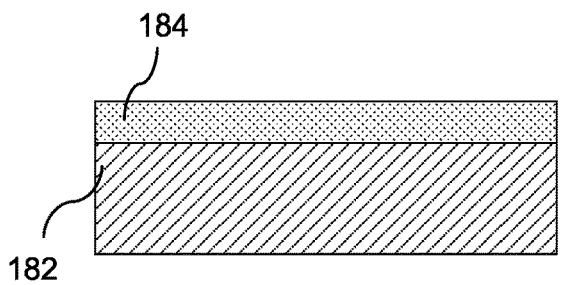
Figure 1C:
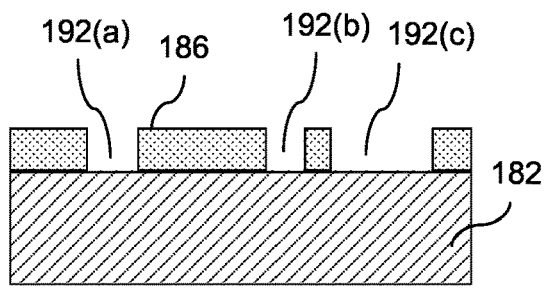
Figure 1D:
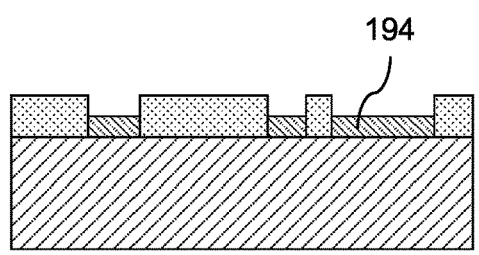
Figure 1E:
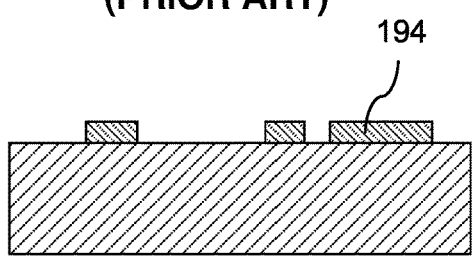
Figure 1F:
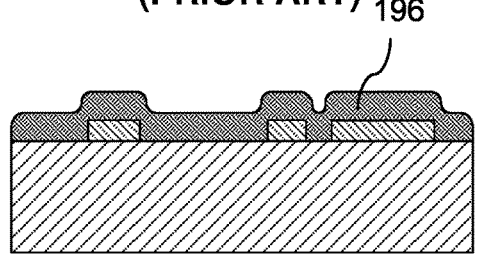
Figure 1G:
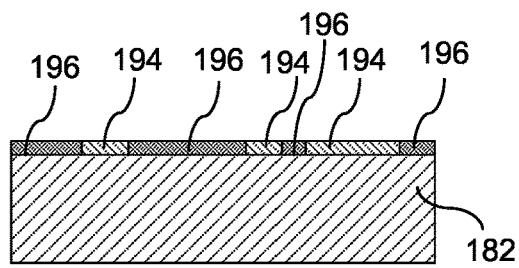
FIG. 1G depicts the completion of formation of the first layer resulting from planarizing the deposited materials to a desired level.
Figure 1H:
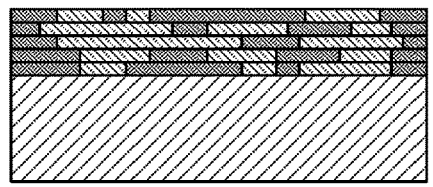
FIGS. 1H and 1I respectively depict the state of the process after formation of the multiple layers of the structure and after release of the structure from the sacrificial material.
Figure 1I:
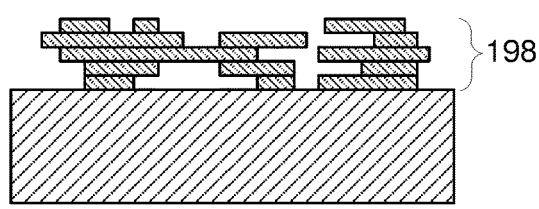
Figure 2A:
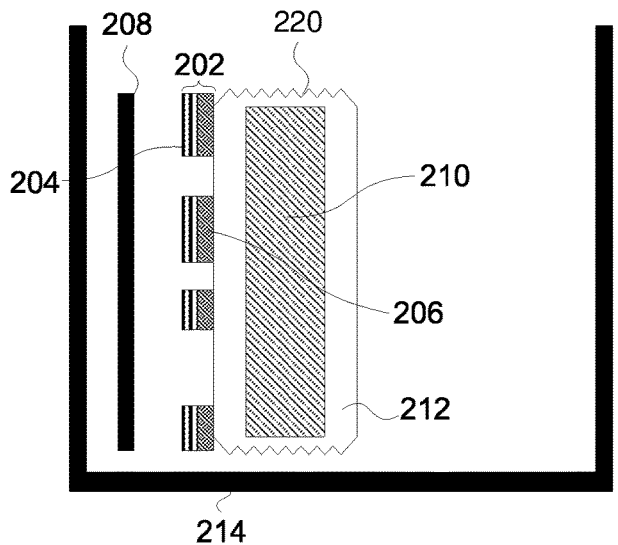
FIGS. 2A-2F provide illustrations of an example set up and operation of an ELEX process for forming a plurality of longitudinally extended structures.
Figure 2B:
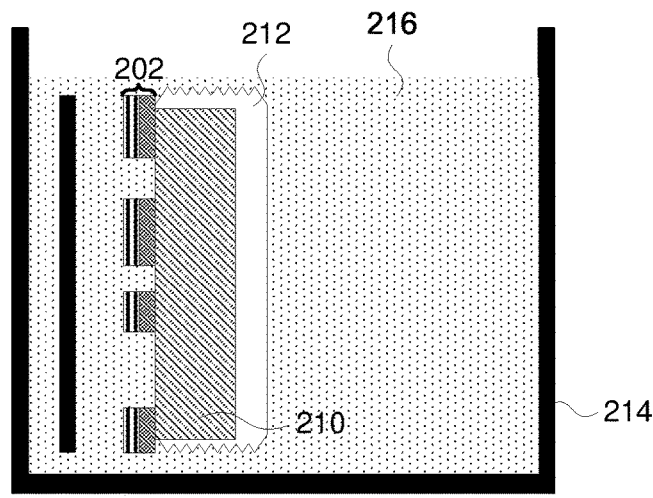
Figure 2C:
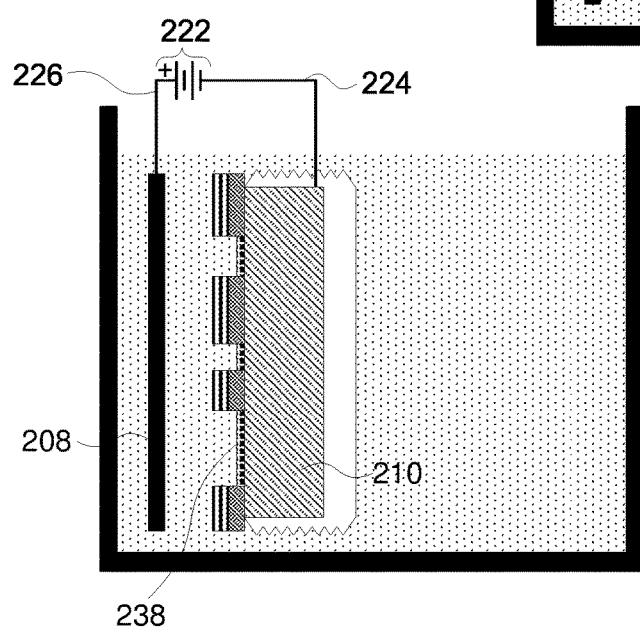
Figure 2D:
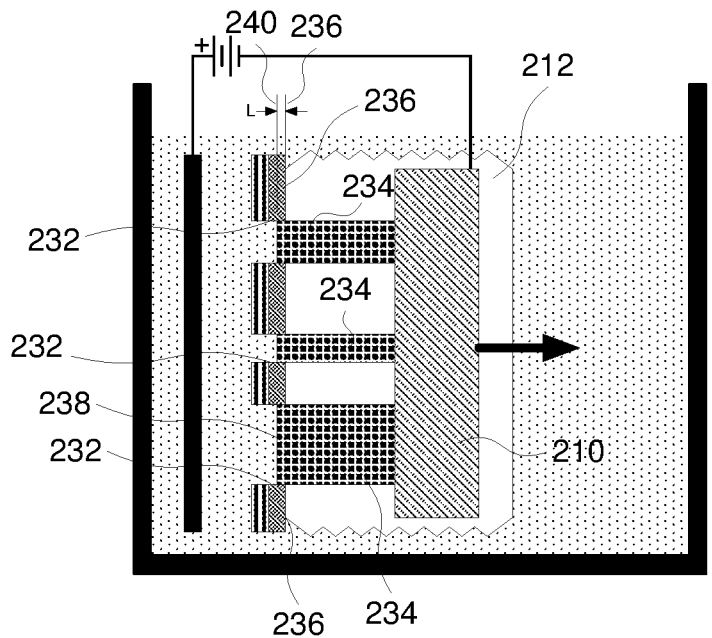
Figure 2E:
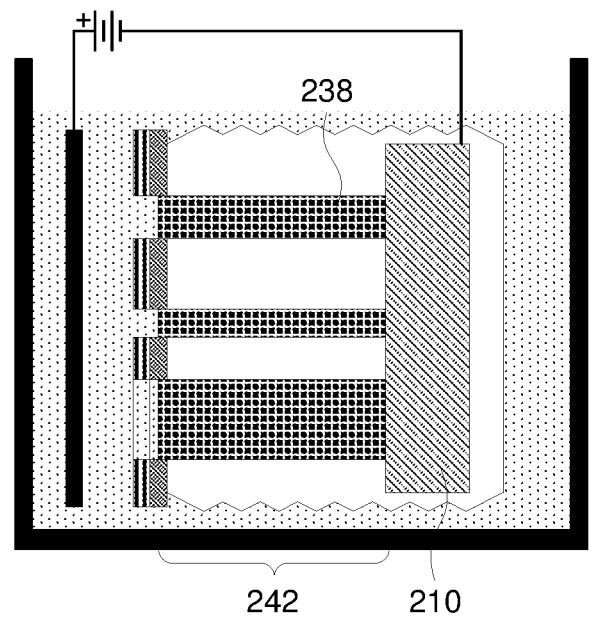
Figure 2F:
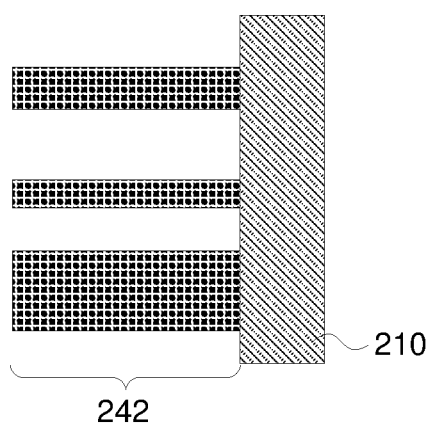

DETAILED DESCRIPTION OF PREFERRED EMBODIMENTS:

Electrochemical Fabrication in General

An example of a multi-layer, multi-material electrochemical fabrication process was provided above in conjunction with the illustrations of FIGS. 1A-1I. In some variations, the structure may be separated from the substrate. For example, release of the structure (or multiple structures if formed in a batch process) from the substrate may occur when releasing the structure from the sacrificial material particularly when a layer of sacrificial material is positioned between the first layer of the structure and the substrate. Alternative methods may involve, for example, the use of a dissolvable substrate that may be separated before, during or after removal of the sacrificial material, machining off the substrate before or after removal of the sacrificial material, or use of a different intermediate material that can be dissolved, melted or otherwise used to separate the structure(s) from the substrate before, during, or after removal of the sacrificial material that surround the structure(s).

Various embodiments of various aspects of the invention are directed to formation of three-dimensional structures from materials, some, or all, of which may be electrodeposited or electroless deposited (as illustrated in FIGS. 1A-1I and as discussed in various patents and patent applications incorporated herein by reference). Some of these structures may be formed from a single build level (e.g. a planarized layer) that is formed from one or more deposited materials while others are formed from a plurality of build levels, each generally including at least two materials (e.g. two or more layers, five or more layers, and even ten or more layers). In some embodiments, layer thicknesses may be as small as one micron or as large as one hundred to two hundred microns. In still other embodiments, layers may be up to five hundred microns, one millimeter, even multiple millimeters, or more. In other embodiments, thinner layers may be used. In still other embodiments, layer thickness may be varied during formation of different levels of the same structure. In some embodiments, microscale structures have lateral features positioned with 0.1-10 micron level precision and minimum feature sizes on the order of microns to tens of microns. In other embodiments, structures with less precise feature placement and/or larger minimum features may be formed. In still other embodiments, higher precision and smaller minimum feature sizes may be desirable. In the present application, meso-scale and millimeter-scale have the same meaning and refer to devices that may have one or more dimensions that may extend into the 0.1-50 millimeter range, or somewhat larger, and features positioned with a precision in the micron to 100 micron range and with minimum feature sizes on the order of several microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), adhered masks and masking operations (masks and operations that use masks that are adhered to a substrate onto which selective deposition or etching is to occur as opposed to only being contacted to it), and/or selective patterned deposition of materials (e.g. via extrusion, jetting, or controlled electrodeposition) as opposed to masked patterned deposition. Conformable contact masks, proximity masks, and non-conformable contact masks share the property that they are preformed and brought to, or in proximity to, a surface which is to be treated (i.e. the exposed portions of the surface are to be treated). These masks can generally be removed (for one or more reuses) without damaging the mask or the surface that received treatment to which they were contacted or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways, including: (1) by application of a photoresist, selective exposure of the photoresist, and then development of the photoresist; (2) selective transfer of pre-patterned masking material; (3) direct formation of masks from computer-controlled depositions of material; and/or (4) laser ablation of a deposited material. In some embodiments, or during the formation of some layers, structural material may be deposited directly into mask openings as illustrated in FIGS. 1A-1F while in other embodiments, the sacrificial material may be deposited into mask openings, followed by removal of masking material which in turn is followed by deposition of structural material and then by planarization.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration). Such use of selective etching and/or interlaced material deposition in association with multiple layers is described in U.S. patent application Ser. No. 10/434,519, by Smalley, filed May 7, 2003, which is now U.S. Pat. No. 7,252,861, and which is entitled "Methods of and Apparatus for Electrochemically Fabricating Structures Via Interlaced Layers or Via Selective Etching and Filling of Voids". This referenced application is incorporated herein by reference.

Temporary substrates on which structures may be formed may be of the sacrificial-type (i.e. destroyed or damaged during separation of deposited materials to the extent they cannot be reused), non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g. replanarizing one or more selected surfaces or applying a release layer, and the like) though they may or may not be reused for a variety of reasons.

Definitions of various terms and concepts that may be used in understanding the embodiments of the invention (either for the devices themselves, certain methods for making the devices, or certain methods for using the devices) will be understood by those of skill in the art. Some such terms and concepts are discussed herein while other such terms are addressed in the various patent applications to which the present application claims priority and/or which are incorporated herein by reference.

The term "longitudinal" as used herein refers to a long dimension of a probe, an end-to-end dimension of the probe, or a tip-to-tip dimension. Longitudinal may refer to a generally straight line that extends from one end of the probe to another end of the probe or it may refer to a curved or stair-stepped path that has a sloped or even changing direction along a height of the probe. When referring to probe arrays, the longitudinal dimension may refer to a particular direction the probes in the array point or extend, but it may also simply refer to the overall height of the array that starts at a plane containing a first end, tip, or base of a plurality of probes and extends perpendicular thereto to a plane containing a second end, tip, or top of the probes. The context of use typically makes clear what is meant especially to those of skill in the art. It is intended that the interpretation to be applied to the term herein be as narrow as warranted by the details of the description provided or the context in which the term is used. If however, no such narrow interpretation is warranted, it is intended that the broadest reasonable scope of interpretation apply.

The term "lateral" as used herein is related to the term longitudinal. In terms of the stacking of layers, lateral refers to a direction within each layer, or two perpendicular directions within each layer (i.e. one or more directions that lie within a plane of a layer that are substantially perpendicular to the longitudinal direction). When referring to probe arrays, laterally generally has a similar meaning in that a lateral dimension is generally a dimension that lies in a plane that is parallel to a plane of the top or bottom of the array (i.e. substantially perpendicular to the longitudinal dimension). When referring to probes themselves, the lateral dimensions may be those that are perpendicular to an overall longitudinal axis of the probe, a local longitudinal axis of the probe (that is local lateral dimensions), or simply the dimensions similar to those noted for arrays or layers. The context of use typically makes clear what is meant especially to those of skill in the art. It is intended that the interpretation to be applied to the term herein be as narrow as warranted by the details of the description provided or the context in which the term is used. If no such narrow interpretation is warranted, it is intended that the broadest reasonable scope of interpretation apply.

Generalized Probe Array and Probe Array Formation Embodiments:

Probe arrays, methods of making probe arrays, and methods of using probe arrays can take on different forms in different embodiments of the invention.

Figure 4:
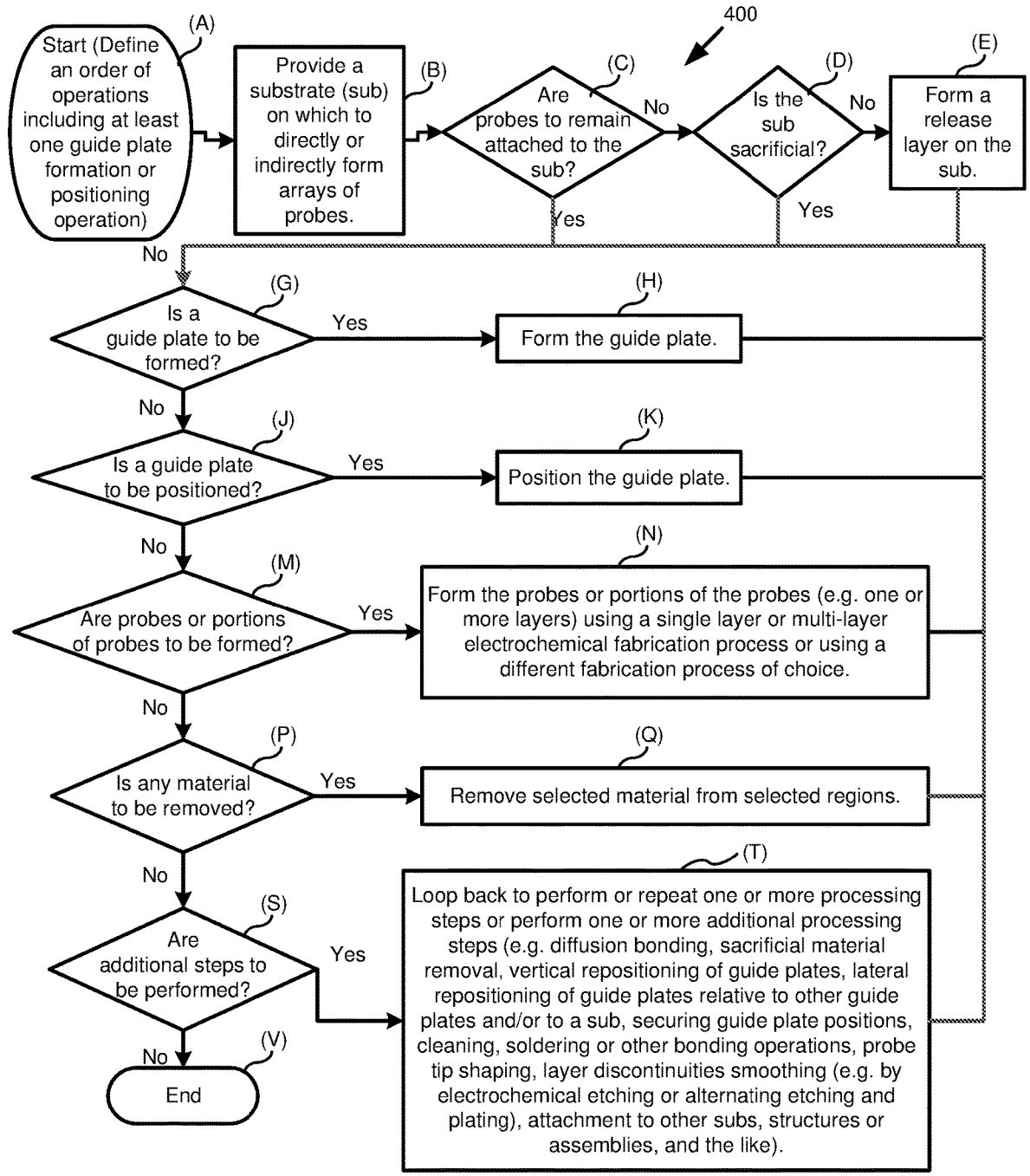
FIG. 4 provides a generalized flowchart for fabricating probe arrays that include a plurality of probes formed with lateral positions corresponding to an array pattern, one or more guide plates formed or positioned to engage the probes, and possibly a substrate on which the probes are formed or attached after formation.

FIG. 4 provides a generalized flowchart for fabricating probe arrays that include a plurality of probes formed with lateral positions corresponding to an array pattern, one or more guide plates formed or positioned to engage the probes, and possibly a substrate on which the probes are formed or attached after formation. The flowchart 400 of FIG. 4 includes blocks (A)-(V) with blocks (C), (D), (G), (J), (M), (P), and (S) representing enquires or decision blocks and blocks (B), (E), (H), (K), (N), (Q), and (T) representing process steps or groups of steps that may be performed, while (A) and (V) represent process initiation and termination blocks. Though not specifically indicated, at some point during the one or more loops through the process, a guide plate is to be formed or positioned with the placement or formation occurring prior to the removal of all of the sacrificial material that forms part of the layers and most preferably where sacrificial material that remains in place helps hold the probes or partially formed probes in fixed positions so that the probes are in known relative positions during guide plate formation or placement. It is not intended that the process of FIG. 4 represent a single process with all the indicated steps and enquires being made or performed, but instead it is intended to provide a framework which may be used in defining numerous alternative processes. Some such alternatives may include most of the process steps and/or decision operations while others may include a much smaller subset of the process steps along with only some or even none of the decision operations. In actual implementations, process operations, decisions, and/or processing order may be manually implemented, implemented under machine control, programmed computer or microprocessor control, or be implemented by a combination of one or more of these. Depending on the order in which process steps are to be executed, a first loop through some or all of blocks (A)-(T) may result in one or more steps being performed while one or more subsequent loops may repeat one or more steps, perform one or more other steps, or result in the performance of a combination of the two. During implementation, numerous process steps and decisions not explicitly noted in the flowchart may be performed including, for example, cleaning steps, activation steps, inspection or testing steps and outcome based decisions, removal and rework steps, and the like. In some embodiments, some steps may be split into sub-steps and only a portion of those sub-steps actually performed.

Figure 5:
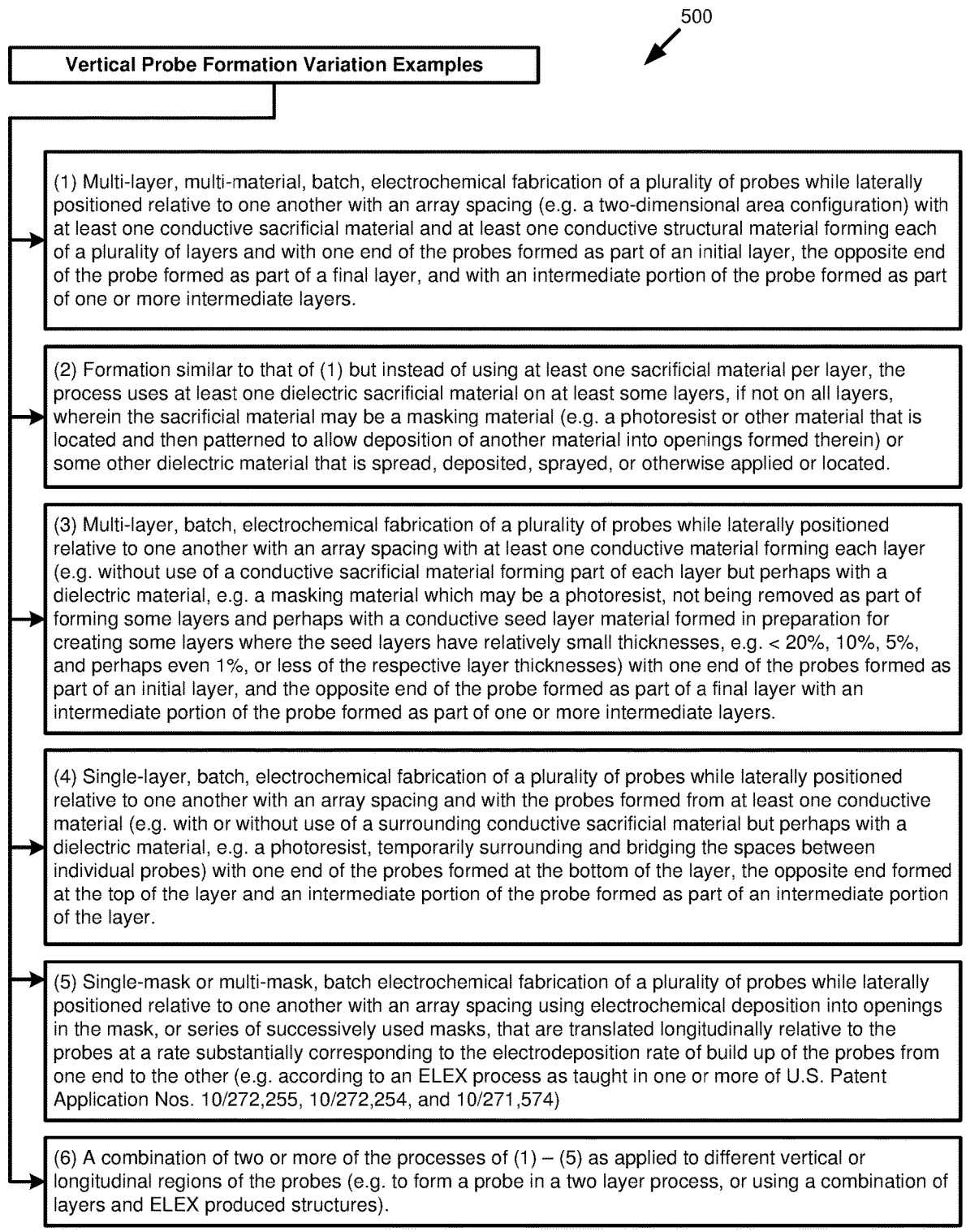
FIG. 5 provides a block diagram setting forth a number of example alternative processes that may be used in forming probes.

FIG. 5 provides a block diagram setting forth a number of example alternative processes that may be used in forming probes. In particular, the block diagram 500 of FIG. 5 provides six example process variations (1)-(6) for forming probes according to block (N) of FIG. 4 including using a multi-layer, multi-material process including use of conductive structural and sacrificial materials according to block (1), using a multi-layer, multi-material process including use of a conductive structural material and dielectric sacrificial material according to block (2), using a multi-layer process including use of a conductive structural material, possibly an unremoved masking material, and possibly one or more seed layers during the formation of layers according to block (3), using a single layer process according to block (4), a single or multi-mask process involving longitudinal translation of the mask during probe formation according to block (5), and a combination of two or more of the processes of (1)-(5) in forming different longitudinal portions of the probe according to block (6). More specifics concerning the various alternative processes are set forth in FIG. 5 while other potential features, alternatives, and other modifications will be understood by those of skill in the art upon review of the FIG. and other teachings herein. Other embodiments may use other processes for forming probes while in sub-array or array configurations.

Figure 6A:
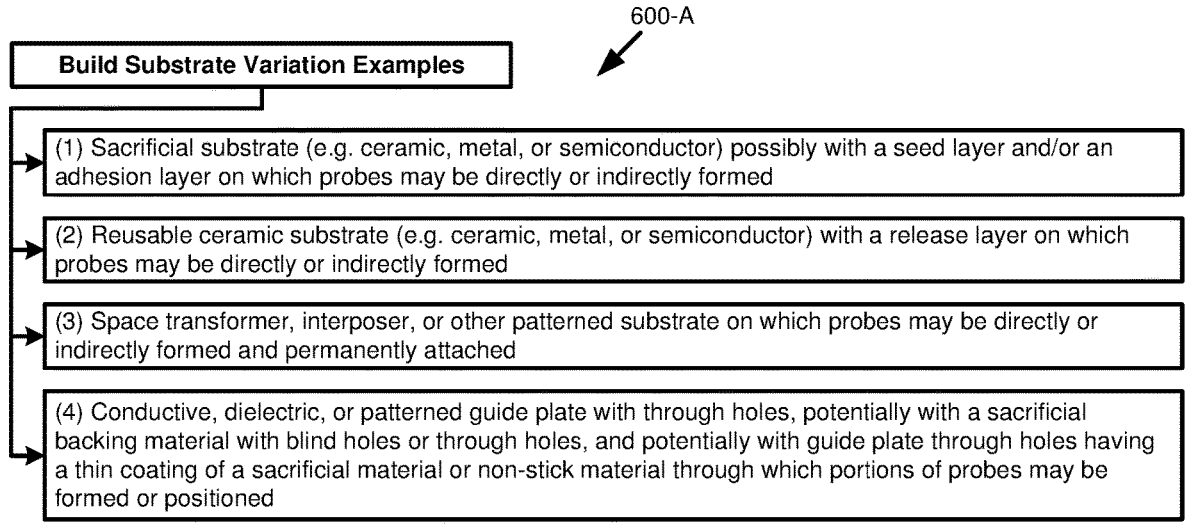
FIG. 6A provides a block diagram listing a number of examples of different build substrates on which probes may be formed.

FIG. 6A provides a block diagram listing a number of examples of different build substrates on which probes may be formed. In particular, block diagram 600-A of FIG. 6A provides four example substrates that may be used in step (B) of FIG. 4 for probe formation including a sacrificial substrate according to block (1), a reusable ceramic substrate according to block (2), a space transformer or other patterned substrate according to block (3), and a guide plate according to block (4). More specifics concerning the various alternative substrates are set forth in FIG. 6A while other potential features, alternatives, and other modifications will be understood by those of skill in the art upon review of the FIG. and other teachings herein. Other embodiments may use other substrates for forming probes while in subarray or array configurations.

Figure 6B:
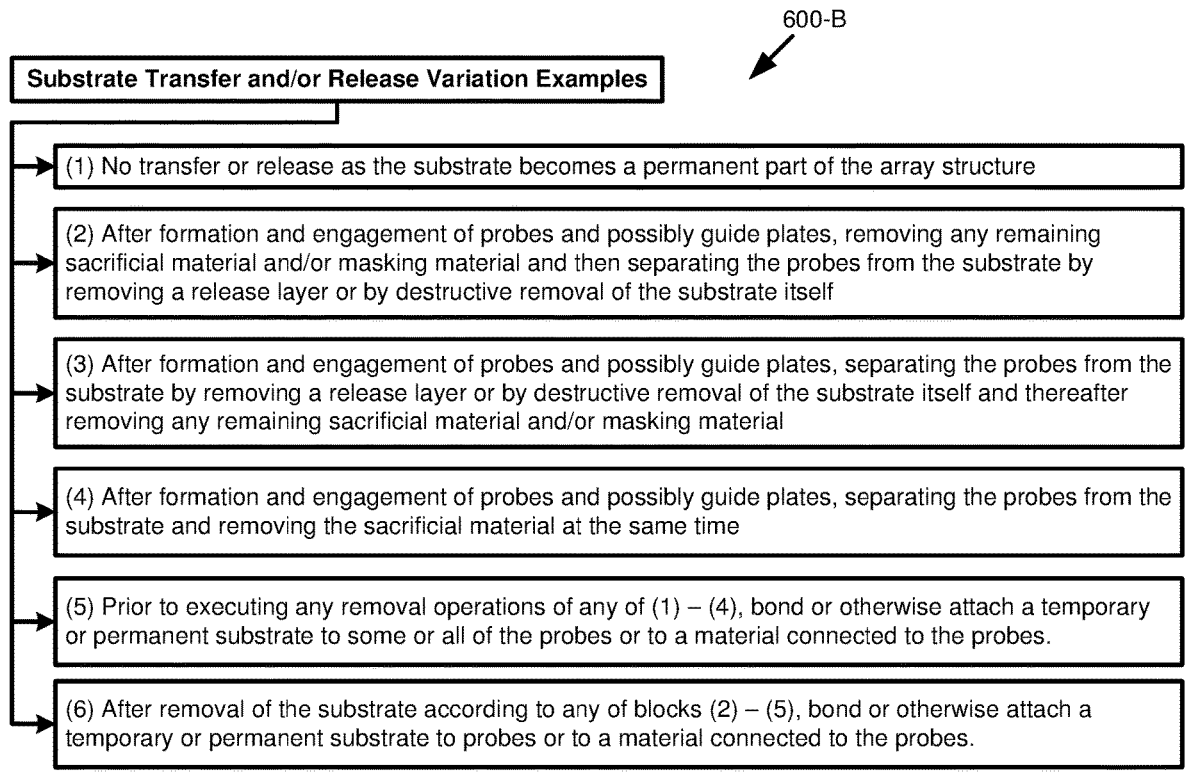
FIG. 6B provides a block diagram listing a number of examples relating to substrate transfer and release.

FIG. 6B provides a block diagram listing a number of examples relating to substrate transfer and release. In particular, block 600-B provides six examples related to substrate transfer or release that may be used in association with steps (Q) and/or (T) of FIG. 4 including a first example where no transfer or release occurs according to block (1); a second example where, after release of sacrificial material, the substrate is removed by removing a release layer or by the destructive removal of the substrate according to block (2); a third example where, before release of sacrificial material, the substrate is removed by removing a release layer or by the destructive removal of the substrate itself which is then followed by removal of the sacrificial material according to block (3); a fourth example where the substrate and sacrificial material and/or masking material are removed at the same time according to block (4); and a fifth example where, before any removal operations of blocks (1)-(4), attaching the opposite ends of the probes, or a material joined to the probes, to a temporary or permanent substrate according to block (5); and according to a sixth example, after release of the build substrate according to any of blocks (2)-(5), bonding or otherwise attaching a temporary or permanent substrate to the probes or to a material joined to the probes. More specifics concerning the transfer and release examples are set forth in FIG. 6A while other potential features, alternatives, and other modifications will be understood by those of skill in the art upon review of the FIG. and other teachings herein. Other embodiments for releasing or transferring probe arrays are possible and will be apparent to those of skill in the art upon review of the teachings herein and/or those set forth in one or more of the applications incorporated herein by reference.

Figure 6C:
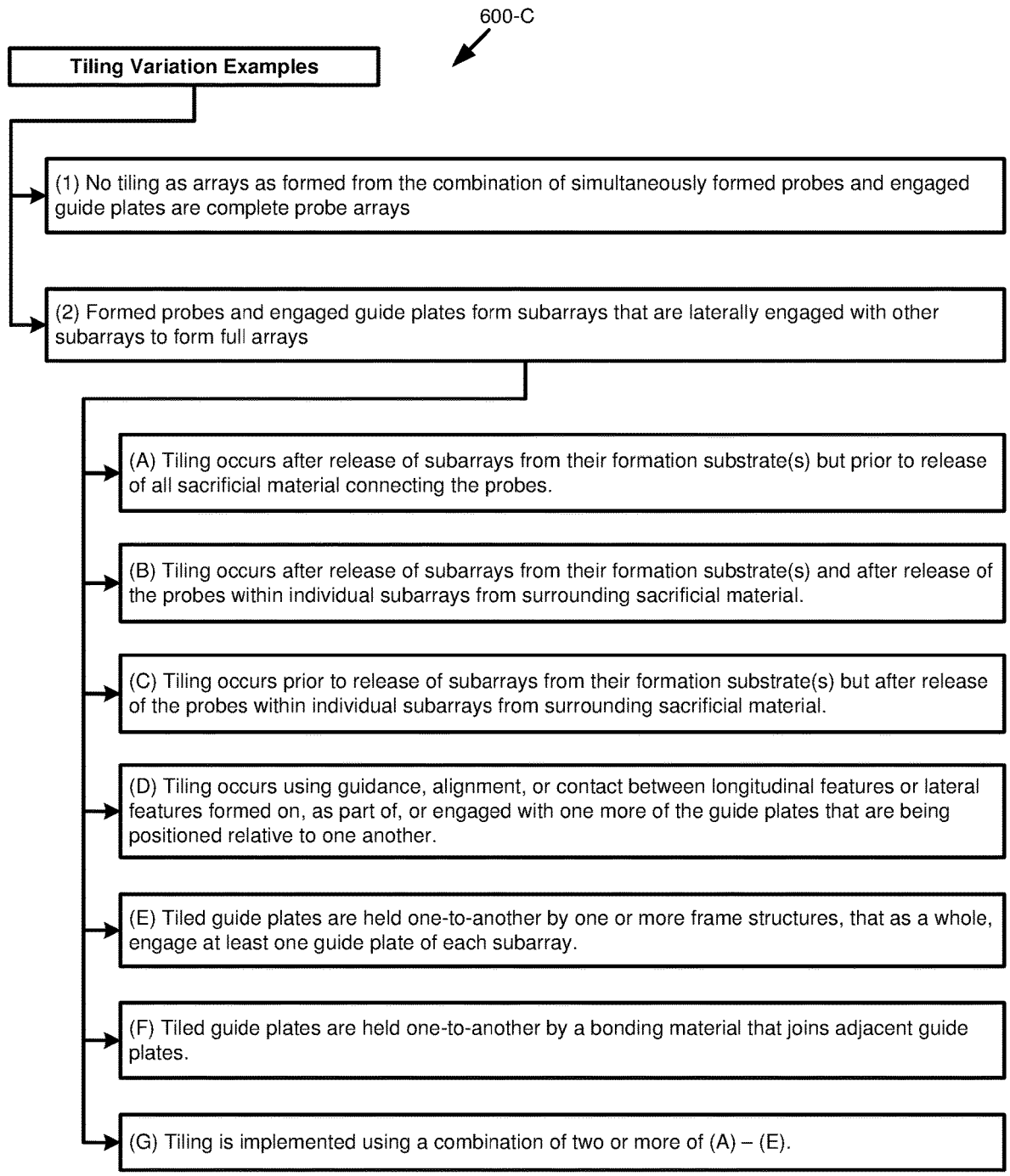
FIG. 6C provides a block diagram that sets forth a number of examples related to tiling of subarrays to one another to form larger probe arrays.

FIG. 6C provides a block diagram that sets forth a number of examples related to tiling of subarrays to one another to form larger probe arrays. In particular, the block diagram 600-C provides two examples with the second example separated into seven variations. In a first example, according to block (1), no tiling is used as the subarray is actually a full array. A second example indicates that subarrays are formed of probes and guide plates that are then laterally engaged with other subarrays to form full arrays and more particularly where the seven alternatives respectively call for: (a) tiling occurring after release of the subarrays from their formation substrate(s) but prior to release of all sacrificial material; (b) tiling occurring after release of the subarrays from their formation substrate(s) and after release of all sacrificial material; (c) tiling occurring prior to release of subarrays from their formation substrate(s) but after release of all sacrificial material; (d) tiling occurring using guidance, alignment, or contact between longitudinal features or lateral features formed on, as part of, or engaged with one or more of the guide plates that are being positioned relative to one another; (e) holding tiled guide plates to one-to-another by one or more frame structures, that as a whole, engage at least one guide plate of each subarray; (f) holding guide plates to one another by use of a bonding material; and (g) tiling occurs using a combination of two or more of (a)-(f).

In other embodiments, tiling may occur using other methods, structures, and/or components and will be apparent to those of skill in the art upon review of the teachings herein and/or those set forth in one or more of the applications incorporated herein by reference.

FIG. 7A provides a block diagram setting forth a number of examples of how guide plates (GPs) may be positioned relative to probes that have been formed or are being formed and alternatively how guide plates may be formed relative to probes that have been formed or are being formed. In particular, block diagram 700-A provides two primary placement examples according to blocks (1) and (2) and two primary formation examples according to blocks (3) and (4) along with several more detailed implementation examples for blocks (1) and (3) that may be part of blocks (H) and/or (K) of FIG. 4. Other alternatives are possible and include, for example, placement or formation of guide plates prior to probe formation and then forming probes on them or engaged with them.

Figure 7B:
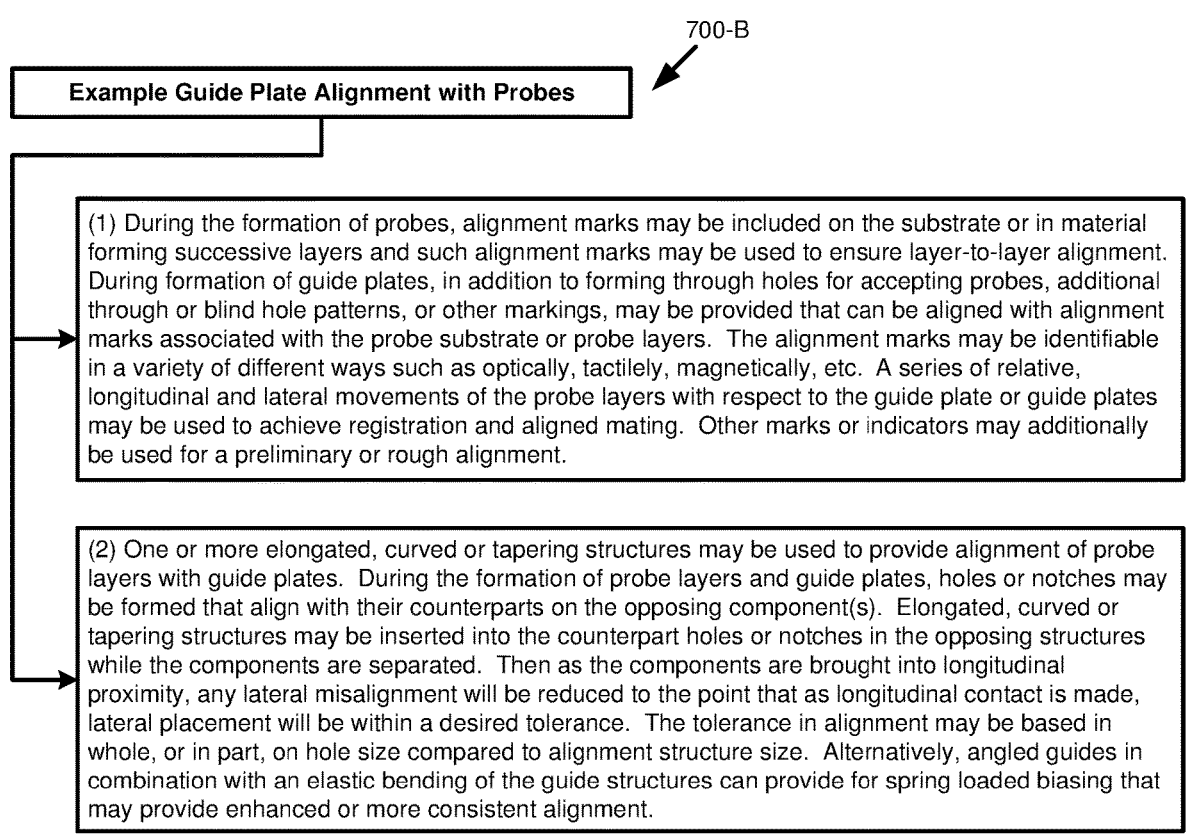
FIG. 7B provides a block diagram setting forth two examples of how guide plates and probes may be laterally aligned.
Figure 8F:
Figure 8G:
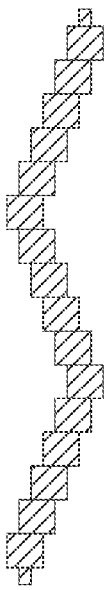
Figure 8H:
Figure 8I:
Figure 8J:
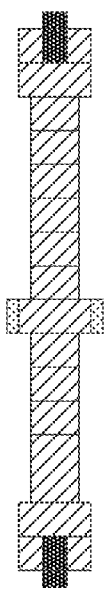

FIG. 7B provides a block diagram setting forth examples of how guide plates and probes may be laterally aligned. In particular, block diagram 700-B provides two examples of alignment methods that may be used in implementing the examples of FIG. 7A. Other alignment alternatives are possible and will be apparent to those of skill in the art upon review of the teachings herein and/or those set forth in one or more of the applications incorporated herein by reference.

In summary, the general process flow of FIG. 4 may be executed using different combinations of steps, different orders of steps, different repetitions of steps, and using different alternative implementations of steps or groups of steps as specifically set forth in the examples of FIGS. 5-7B.

FIGS. 8A-8J set forth a number of example probe configurations that may be used in the probe arrays of the various embodiments of the present invention. Many other probe configurations are possible and may be used in the probe arrays of the various embodiments of the present invention. Some such other configurations are set forth in various applications incorporated herein by reference. In different embodiments, probes may include additional materials, combinations of different metals, combinations of one or more metals with one or more dielectrics, single beam structures, multiple spaced beam structures, coaxial or other shielded structures. Probes may be formed from different numbers of layers or be formed with different layer stacking orientations relative to a longitudinal axis or bending axis.

FIG. 9 provides a block diagram setting forth a number of example probe-to-guide plate interfaces that may exist in some embodiments of the present invention. In particular, block diagram 900 sets forth eight example interface variations ranging from straight single layer probes to multi-layer probes having layer boundaries or lateral configurations that are intended to engage or avoid engagement with the guide plates in controlled ways. Other variations are possible and will be apparent to those of skill in the art upon review of the teachings herein.

FIGS. 10A-10H provide examples illustrating the various interfaces set forth in the block diagram of FIG. 9.

The variations of FIGS. 8A-10H may be mixed and matched, and mixed and matched to selected steps and/or process examples of FIGS. 4-7B, to provide numerous probe array configurations, probe array formation methods, and/or probe array usage embodiments.

Specific Embodiment Examples:

To further enhance understanding of the scope of the generalized embodiments discussed above, specific illustrative examples are set forth below.

FIG. 11 provides a simplified flowchart of a first specific embodiment of the invention for forming a probe array with a guide plate inserted from above after probe formation and after partial removal of a sacrificial material. Flowchart 1100 sets forth steps or groups (A)-(G). Numerous variations of this embodiment are possible, for example: (1) additional steps may be added; (2) alternative steps may be used; (3) alternative step orders may be used; (4) steps may be sub-divided into more focused tasks or operations; (5) alternative probe materials, sacrificial materials, and or masking materials may be used in the formation of one or more layers or portions of layers to allow, for example, enhanced probes to be formed or more controlled or even staged material removal to provide more controlled or reliable guide plate insertion and positioning; (6) alternative probe configurations may be used for some or all probes, (7) some probes may have different longitudinal starting positions or ending positions, (8) probes may have contact tips or mounting ends formed with specific configurations for contact specific surfaces, to provide specific functionality, and/or be formed from specific material, e.g. abrasion resistant materials, low contact resistant materials, and the like; (9) both ends of the probe may have contact tips as opposed to one contact tip and one mounting end; (10) bottoms of probes may not only remain attached to a substrate but have their bottom ends remain encased in a dielectric support material; (11) regions between probes may be partially or completely filled with compressible dielectric material, for example, to aid in providing elastic force or to aid in ensuring non-shorting between closely spaced probes upon deflection; (12) probe arrays may have uniform spacings between all probes; (13) probe arrays may have gaps in probe positions; (14) probe arrays may include probes with non-uniform spacings, e.g. varying pitch; (15) probe arrays may have probe tips configured in one-dimensional configurations (N×1); (16) probe arrays may have probe tips configured in two-dimensional arrays (N×M); (17) one or two dimensional arrays may have tips located at more than one longitudinal plane; (18) arrays may have only a small number of probes, e.g. under 10, a moderate number of probes, e.g. tens to hundreds, a large number of probes, e.g. hundreds to thousands, or even a very large number of probes, e.g. from thousands to tens-of-thousands or more; (19) probes may be formed from as little as one layer or as many as tens of layers, or more; (20) probes may be formed from planarized layers or non-planarized layers; (21) layers may include sacrificial material of a variety of types or may use no sacrificial material; (22) more than one guide plate may be inserted; (23) more than one guide plate may be used and inserted and initially located at final longitudinal levels or they may be initially located and thereafter moved to final longitudinal positions, for example after further removal of sacrificial material or lateral shifting of other guide plates; (24) the substrate may be removed in favor of insertion of, or formation of, one or more additional guide plates, prior to probe formation, during probe formation or after probe formation, where insertion may occur from above or below and formation may occur while probes are engaged or before engagement occurs; (25) lateral alignment and longitudinal alignment of guide plates and probes may be separated by a variety of intermediate steps or operations; and/or (26) some or all single guide plates may be replaced by composite or paired guide plates that are laterally and/or longitudinally positionable relative to one another, or that are held in fixed lateral and/or longitudinal positions relative to one another at the time of positioning (e.g. due to fixturing or due to a material located at least in part therebetween which may be removed or retained after positioning and which in the case of retention may provide, in addition to configurational stability, general conductive and or dielectric properties to the guide plate assembly and associated probes and/or specific electrical connection or isolation of selected probes relative to the guide plates or to one another). Other possible variations include those allowed in the generalized flowchart of FIG. 4, the examples of FIGS. 5-10H, and/or the steps set forth in the other specific embodiments.

Figure 12D:
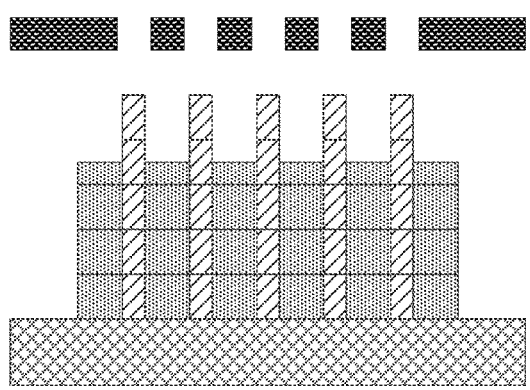
Figure 12F:
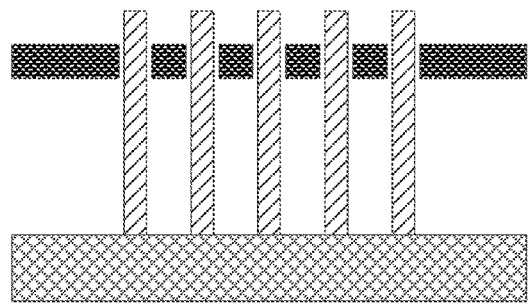
Figure 12E:
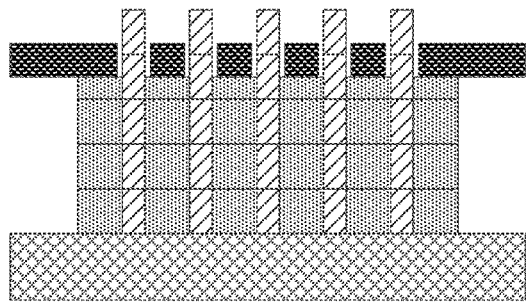
Figure 12G:
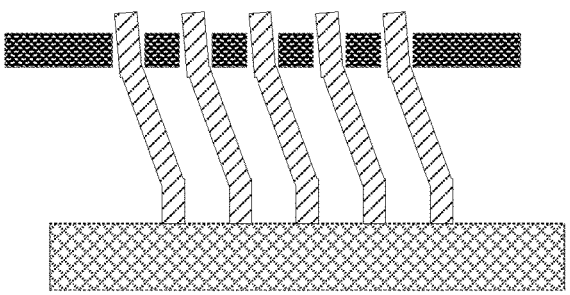

FIGS. 12A-12G provide cut side views of example results of the steps set forth in operational blocks (A)-(G) of FIG. 11. In particular, in this example, the formation of an array of probes (exemplified with five probes) occurs via the formation of multiple layers (exemplified with five layers) and where the probes are to be held at their lower ends by a substrate and laterally positioned near their upper ends, or contact ends, by a guide plate that will allow elastic compression of the probes when the probes are made to contact an electronic component wherein the following states of the process can be seen with each being associated with a corresponding step in the flowchart of FIG. 11: (1) a substrate after being supplied (FIG. 12A), (2) probes and surrounding sacrificial material after buildup of a number of multi-material layers on the substrate (FIG. 12B), (3) some upper layers without sacrificial material due to removal of a portion of the sacrificial material (FIG. 12C), for example by dissolving or ablation, (4) a guide plate after lateral placement above the probes (FIG. 12D), (5) the guide plate after longitudinal placement around the probe ends (FIG. 12E), (6) a completed or partially completed array without sacrificial material due to the removal of the remaining sacrificial material (FIG. 12F), and (7) the probe array in an uncompressed operational state after an optional relative lateral shifting that provides the probes with a desired placement, shape, and/or configuration (FIG. 12G). In variations of the embodiment of FIGS. 11 and 12A-12G, for example, the shaping of the probes by guide plate displacement may provide only elastic deformation or possibly some amount of plastic deformation; the lateral displacement of the probes may be at an initial level that is greater than a final level such that elastic deformation is reduced or even eliminated; structures may be used to hold the guide plate at a desired longitudinal height above the substrate (not shown); structures may be used to hold the guide plate and the substrate at intended lateral offsets (not shown); and any additional support structures may located laterally beyond the probes and/or may be located laterally intermediate to the probes.

FIG. 13 provides a simplified flowchart of a second specific embodiment of the invention for forming a probe array with a guide plate inserted from above after probe formation but without initial removal of sacrificial material since no sacrificial material was used in the formation of one or more of the final layers of the probes. Flowchart 1300 sets forth steps, or groups of steps, (A)-(F) for forming probes and engaging a guide plate.

Figure 14C:
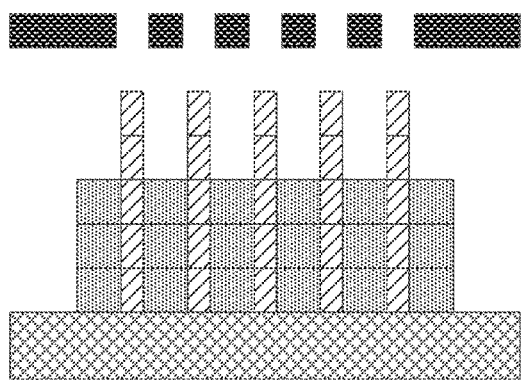
Figure 14E:
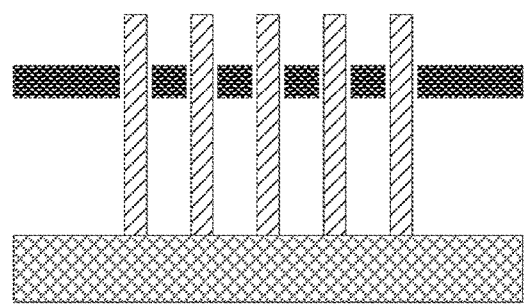
Figure 14D:
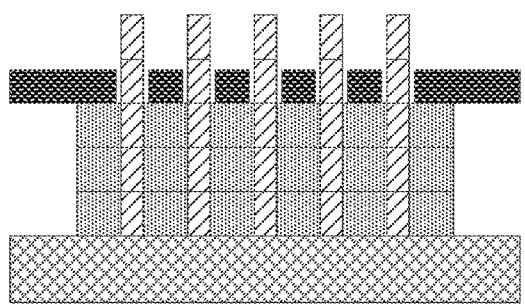
Figure 14F:
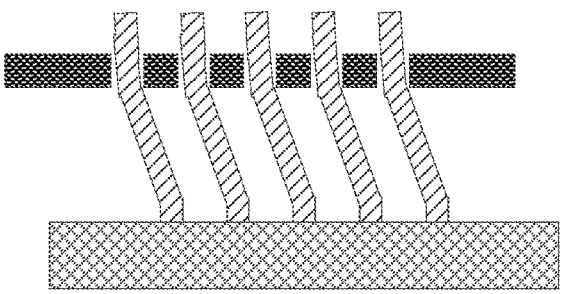

FIGS. 14A-14F provide cut side views of example results of the steps set forth in operational blocks (A)-(F) of FIG. 13. In particular, in this example, the formation of an array of probes (exemplified with five visible probes) occurs via the formation of a plurality of layers (exemplified with five layers) where the probes are to be held at their lower ends by a substrate and laterally positioned near their upper ends, or contact ends, by a guide plate that allows elastic compression of the probes when the probes are made to contact an electronic component wherein the following states of the process can be seen and with each being associated with a corresponding step in FIG. 13: (1) a substrate after being supplied (FIG. 14A), (2) probes with surrounding sacrificial material (i.e., part of the lower three layers of the example) or masking material (i.e., part of the upper two layers of the example) after the formation of a number of multi-material layers on the substrate (FIG. 14B-1), (3) probes having exposed ends due to the removal of masking material from the two upper layers (FIG. 14B-2), (4) a guide plate after lateral placement above the probes (FIG. 14C), (5) the guide plate after longitudinal placement around the probe ends (FIG. 14D), (6) the completed, or partially completed, probe array without sacrificial material due to the removal of the remaining sacrificial material (FIG. 14E), and (7) the probe array in an uncompressed operational state (i.e. without longitudinal compression) after an optional relative lateral shifting that provides the probes with a desired placement, shape, and/or configuration (FIG. 14F).

FIG. 15 provides a simplified flowchart of a third specific embodiment of the invention for forming a probe array with a guide plate inserted from below after probe formation. Flowchart 1500 sets forth steps, or groups of steps, (A)-(H).

FIGS. 16A-16H provide cut side views of example results of the steps set forth in operational blocks (A)-(H) of FIG. 15 along with more specific implementation examples in implementing block (C) of FIG. 15 via the illustrations of FIG. 16C-1 to FIG. 16C-4 which provide for incorporation of an additional guide plate. In this example, the formation of an array of probes (exemplified by five visible probes) occurs via the formation of a plurality of layers where the probes are to be held at their lower ends by a lower guide plate and their upper ends by a second guide plate that will allow elastic compression of the probes from both the top and the bottom when the probes are made to contact upper and lower electronic components directly or indirectly (e.g. through connections to such components, e.g. via interposers or space transformer) wherein states of the process associated with each of the steps or groups of steps of FIG. 15 can be seen: (1) a substrate after being supplied (FIG. 16A), (2) probes and surrounding sacrificial material after buildup of a number of multi-material layers on the substrate (FIG. 16B), (3) probes with upper ends exposed due to the removal of an upper portion of the sacrificial material (FIG. 16C-1), (4) an upper guide plate after lateral placement above the probes (FIG. 16C-2), (5) the upper guide plate engaging the upper ends of the probes after longitudinal placement (FIG. 16C-3), (6) partially completed probe array after removal of the build substrate of step (C) of FIG. 15 (FIG. 16C-4), (7) the partially completed probe array after removal of a lower portion of the sacrificial material (FIG. 16D), (8) a lower guide plate after lateral placement below the probes (FIG. 16E), (9) the lower guide plate around the lower ends of the probes after longitudinal placement (FIG. 16F), (10) the completed or partially completed probe array after removal of the remaining sacrificial material (FIG. 16G), and (11) the probe array in an uncompressed operational state after an optional relative lateral shifting that provides the probes with a desired placement, shape, and/or configuration (FIG. 16H).

Figure 17:
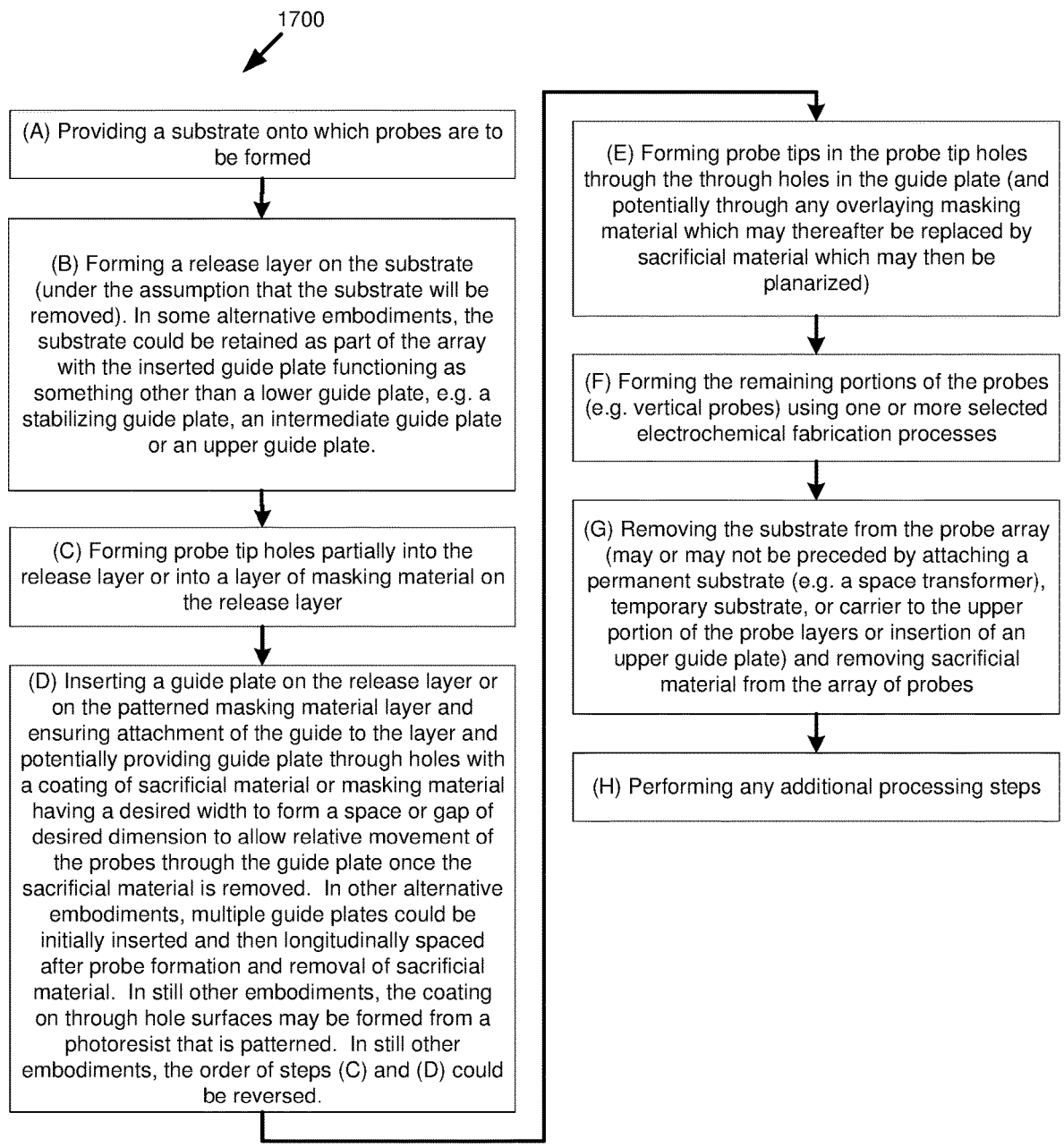
FIG. 17 provides a simplified flowchart of a fourth specific embodiment of the invention for forming a probe array with a guide plate inserted prior to probe formation so that the probes may be formed while engaged with the guide plate.

FIG. 17 provides a simplified flowchart of a fourth specific embodiment of the invention for forming a probe array with a guide plate inserted prior to probe formation so that the probes may be formed while engaged with the guide plate. Flowchart 1700 sets forth steps, or groups of steps, (A)-(H).

Figure 3:
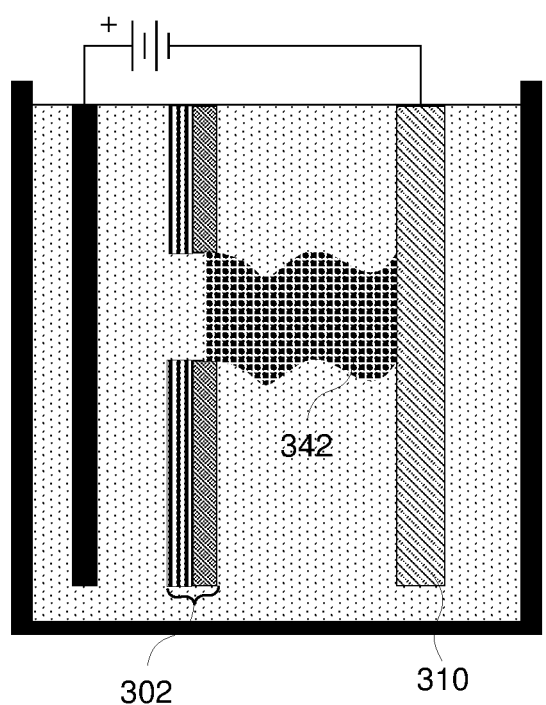
FIG. 3 provides an illustration of an ELEX formation process that provides a structure with varying cross-sectional formation offsets (or lateral offsets) that may be generated during the formation of a longitudinally elongated structure.

FIGS. 18A-18H provide cut side views of example results of the steps set forth in operational blocks (A)-(H) of FIG. 17 along with more specific examples in implementing block (E) of FIG. 17 via illustrations of FIG. 18E-1 to FIG. 18E-5 which provide for structural material deposition preparation and completion of formation of a planar layer and more specific examples for implementing block (G) of FIG. 17 via illustrations of FIG. 18G-1 to FIG. 18G-3 including operations for incorporating an additional upper guide plate and removing the build substrate. In this example, the formation of an array of a plurality of probes (exemplified by five probes) occurs via the formation of multiple layers (exemplified by six build layers) which engage upper and lower guide plates such that elastic compression of the probes from both the top and the bottom can occur when the probes are made to contact upper and lower electronic components directly or indirectly and wherein the following process states, associated with the steps, or groups of steps, of FIG. 19, can be seen: (1) a substrate after being supplied (FIG. 18A), (2) a sacrificial layer formed or applied to the substrate (FIG. 18B), (3) a masking material after being supplied and patterned so the openings can eventually receive a probe material (FIG. 18C), (4) a guide plate with coated through holes after lateral and longitudinal positioning (FIG. 18D), (5) a patterned masking material after formation over the guide plate (FIG. 18E-1), (6) probe material after being deposited into the openings in the masking materials (FIG. 18E-2), (7) the partially formed probe array after masking material is removed (FIG. 18E-3), (8) sacrificial material after being deposited to fill in at least part of the gaps around the ends of the partially formed probes and the guide plate (FIG. 18E-4), (9) the structural and sacrificial materials after planarization to set a planar surface for subsequent layer formation (FIG. 18E-5), (10) the partially formed probe array after additional probe layers have been formed with all but the last including sacrificial material (FIG. 18F), (11) the partially formed probe array after masking material has been removed from the last layer to prepare the upper ends of the probes for receiving a guide plate while the lower portions of the probes remain held in place by sacrificial material (FIG. 18G-1), (12) a second guide plate after lateral and longitudinal positioning to engage with the upper ends of the probes (FIG. 18G-2), (13) the completed or partially completed probe array after remaining sacrificial material has been removed (FIG. 18G-3), and (14) the probe array in an uncompressed operational state after an optional relative lateral shifting that provides the probes with a desired placement, shape, and/or configuration (FIG. 18H).

Figure 19:
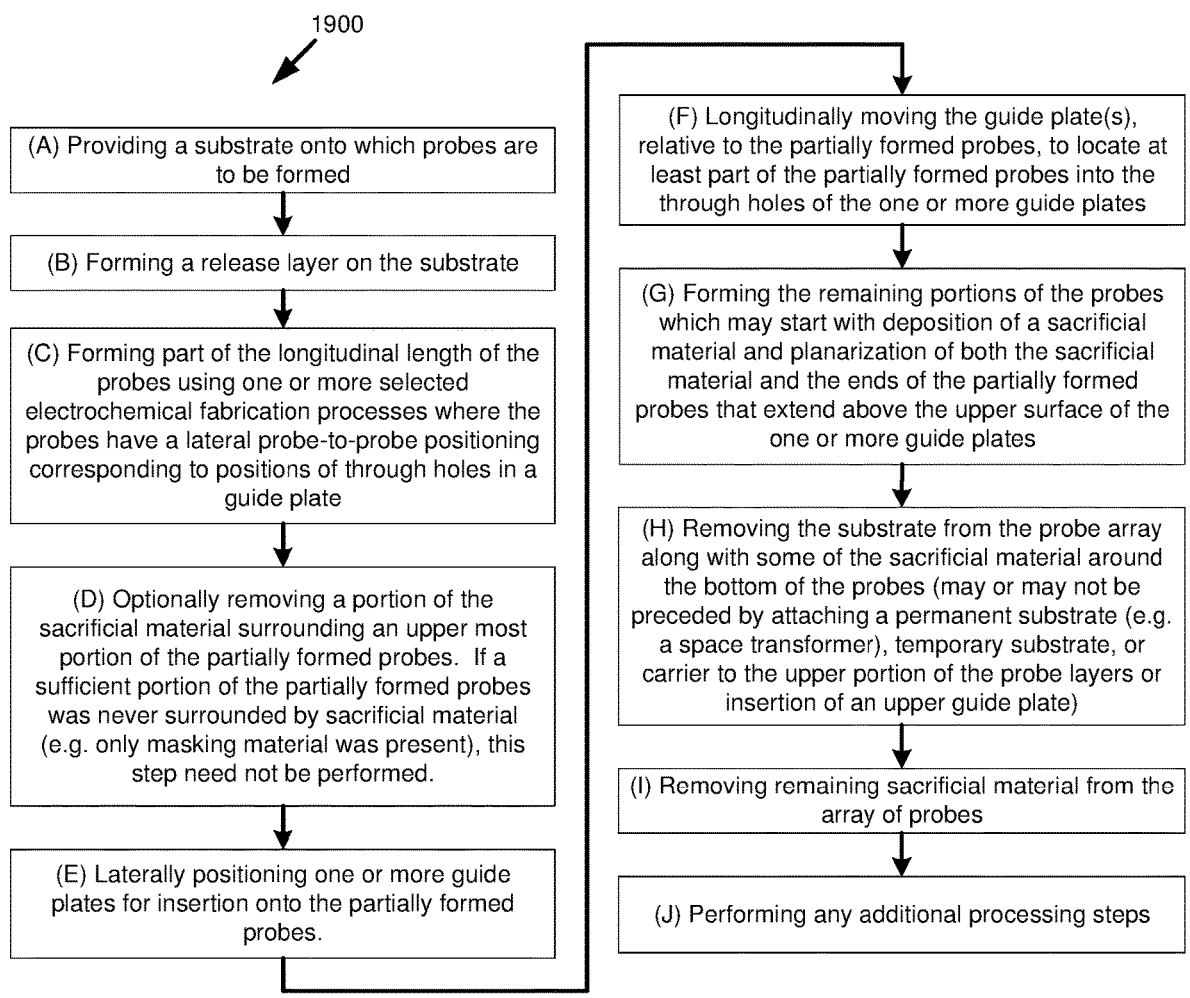
FIG. 19 provides a simplified flowchart of a fifth specific embodiment of the invention for forming a probe array with a guide plate inserted from above after partial formation of the probes followed by completion of the probes and removal of a build substrate which may in turn be followed by addition of further stabilizing elements.

FIG. 19 provides a simplified flowchart of a fifth specific embodiment of the invention for forming a probe array with a guide plate inserted from above and after partial formation of the probes followed by completion of the probes and removal of a build substrate which may in turn be followed by addition of further stabilizing elements. Flowchart 1900 sets forth steps or groups of steps (A)-(J).

FIGS. 20A-20J provide cut side views of example results of the steps set forth in operational blocks (A)-(J) of FIG. 19 along with more specific examples for implementing block (G) of FIG. 19 via the illustrations of FIG. 20G-1 to FIG. 20G-3 wherein additional steps are provided to create a planar surface for formation of additional probe layers, and with more specific examples for implementing block (H) of FIG. 19 via the illustrations of FIG. 20H-1 to FIG. 20H-2 wherein a lower guide plate is provided. In particular, in this example, the formation of an array of a plurality of probes (exemplified with five probes) occurs via the formation of multiple layers (exemplified with five layers) and where the probes are to be held at their lower ends by a lower guide plate and their upper ends by a second guide plate that will allow elastic compression of the probes from both the top and the bottom when the probes are made to contact upper and lower electronic components directly or indirectly wherein the following states of the process can be seen with each being associated with a corresponding step, or groups of steps, set forth in flowchart of FIG. 19: (1) a substrate after being supplied (FIG. 20A), (2) a sacrificial layer after formation on the substrate (FIG. 20B), (3) probes and surrounding sacrificial material after buildup of a number of multi-material layers (FIG. 20C), (4) exposed upper probe ends after removal of an upper portion of the sacrificial material (FIG. 20D), (5) an upper guide plate after lateral placement above the probes (FIG. 20E), (6) the upper guide plate engaging the upper probe ends after longitudinal placement (FIG. 20F), (7) sacrificial material filling in, at least in part, the gaps around the ends of the partially formed probes and the guide plate (FIG. 20G-1), (8) planarized structural and sacrificial materials to set a planar surface for subsequent layer formation (FIG. 20G-2), (9) the partially formed array with one or more additional probe layers (one in this example) which include sacrificial material (FIG. 20G-3), (10) the partially formed array after removal of the build substrate (FIG. 20H-1), (11) the partially formed array after removal of a lower portion of the sacrificial material along with lateral and longitudinal placement of a lower guide plate (FIG. 20H-2), (12) the completed, or partially formed, probe array after removal of the remaining sacrificial material (FIGS. 20I), and (11) the probe array in an uncompressed operational state after an optional relative lateral shifting that provides the probes with a desired placement, shape, and/or configuration (FIG. 20J).

Figure 21:
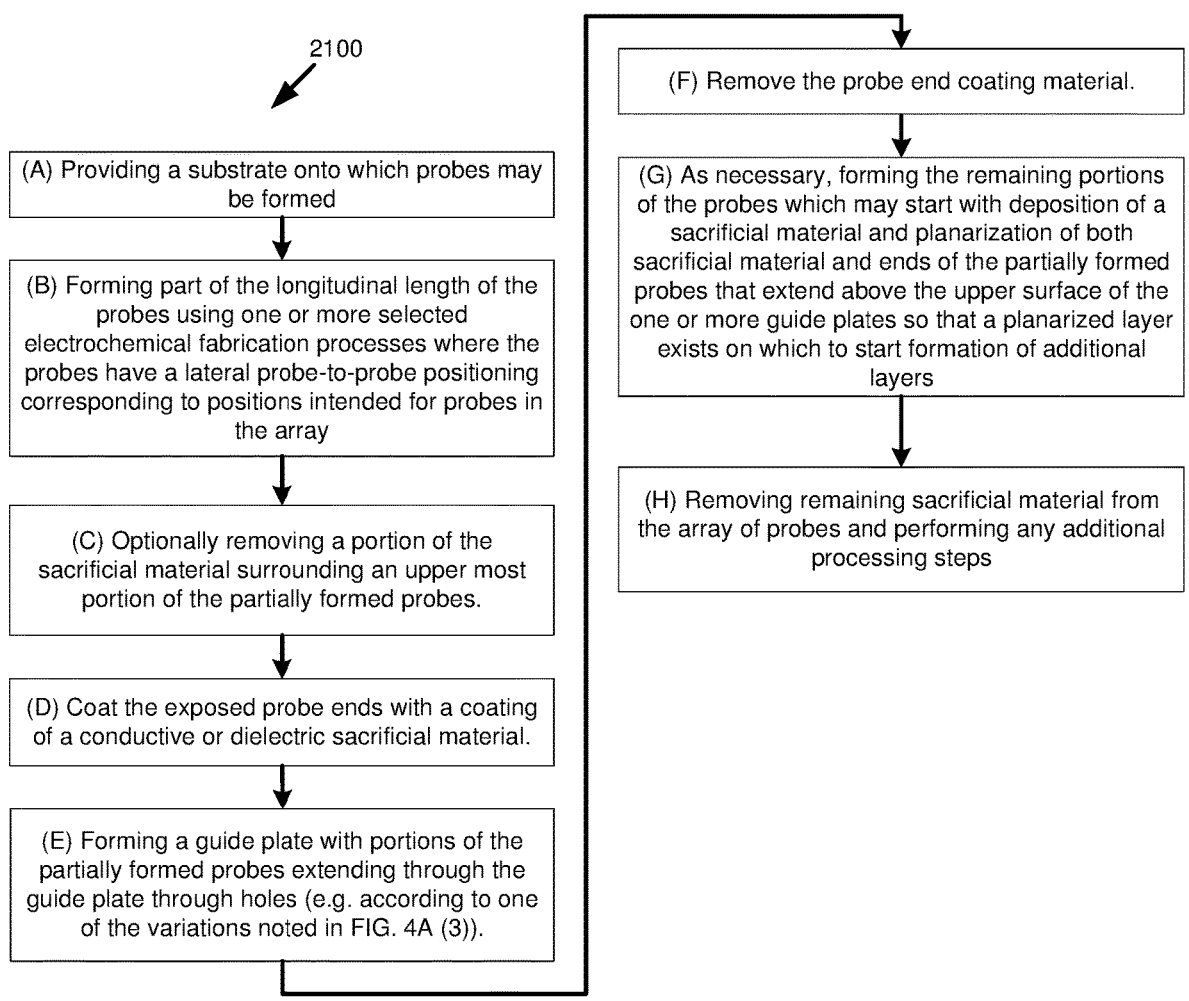
FIG. 21 provides a simplified flowchart of a sixth specific embodiment of the invention for forming a probe array including the formation of a guide plate around a selected longitudinal portion of the probes.

FIG. 21 provides a simplified flowchart of a sixth specific embodiment of the invention for forming a probe array including the formation of a guide plate around a selected longitudinal portion of the probes. Flowchart 2100 sets forth steps, or groups of steps, (A)-(H).

FIGS. 22A-22H provide cut side views of example results of the steps set forth in operational blocks (A)-(H) of FIG. 21. In particular, in this example, the formation of an array of probes (exemplified by five probes) occurs via the formation of a plurality of layers (exemplified by five layers) where the probes are to be held at their lower ends by a substrate and laterally positioned near their upper ends, or contact ends, by a guide plate that is formed around the probes near their upper ends which allows elastic deformation of the probes when made to directly or indirectly contact an electronic component wherein the following states of the process associated with a corresponding step in the flowchart of FIG. 21 can be seen: (1) a substrate after being supplied (FIG. 22A), (2) a plurality of layers located on the substrate after formation of a plurality of multi-material layers including a surrounding sacrificial material on all layers but a last layer which retains a masking material used in the deposition of its structural material (FIG. 22B), (3) exposed probe ends after masking material is removed from the final layer (FIG. 22C), (4) sacrificial material, or mask coatings, around the upper previously exposed portions of the probes (FIG. 22D) to provide a spacing between the probes and the side walls of the guide plate through holes which may be formed by direct patterning of masking material or by depositing sacrificial material into opening within mask material, (5) a guide plate located around the upper ends of the probes after formation of the guide plate around the coating material (FIG. 22E) which may have been formed by deposition or spreading of slurry and then forcing or allowing solidification, (6) the partially formed array after coating material around the probe ends is removed (FIG. 22F), (7) the probe array with additional layers of probes (none shown) (FIG. 22G), and (8) the probe array in an uncompressed operational state after an optional relative lateral shifting that provides the probes with a desired placement, shape, and/or configuration (FIG. 22H).

Figure 23:
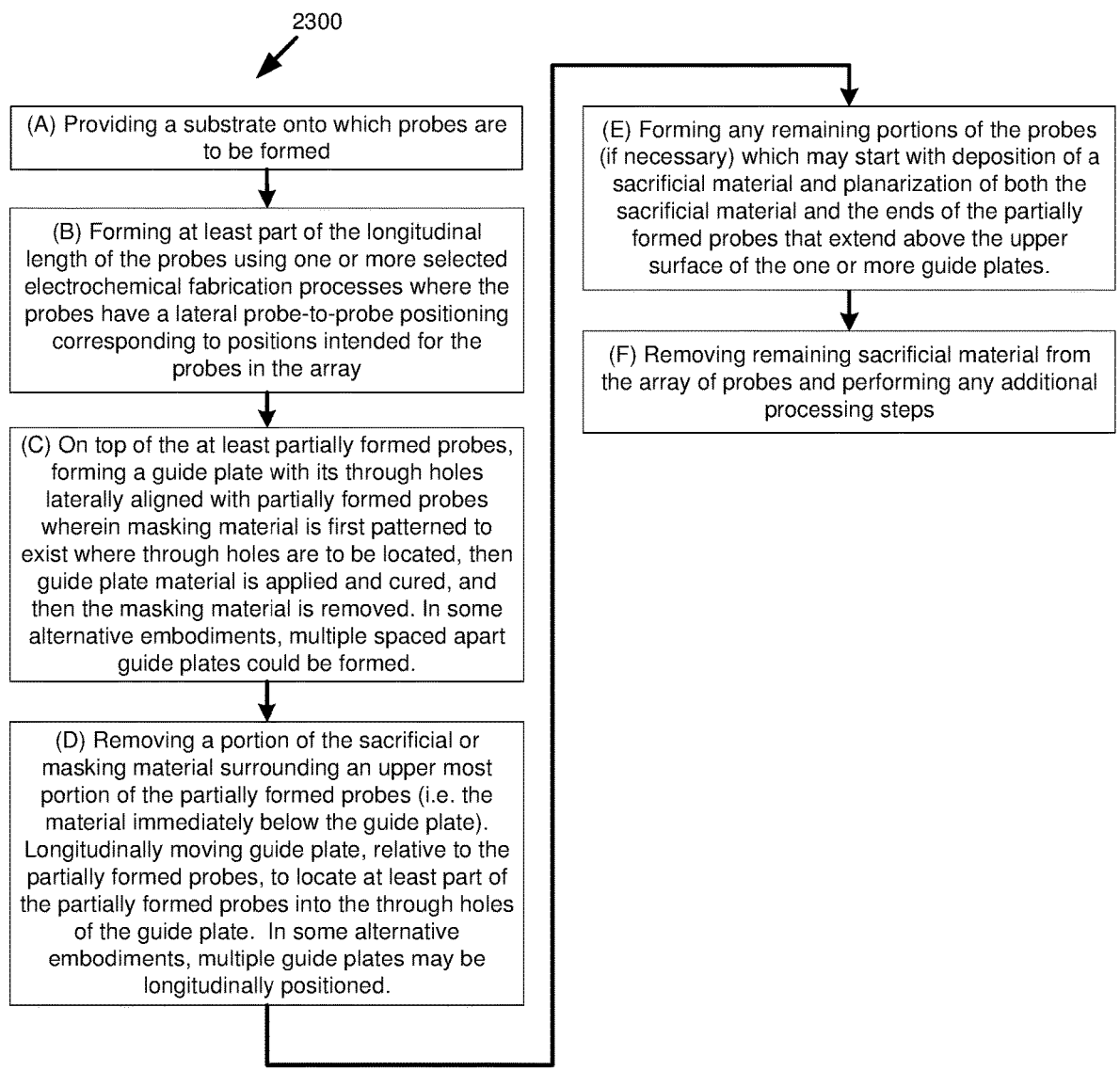
FIG. 23 provides a simplified flowchart of a seventh specific embodiment of the invention for forming a probe array including the formation of a guide plate in lateral alignment with an array of partially formed probes followed by longitudinally co-locating the guide and partially formed probes, and thereafter continuing fabrication of the probes.

FIG. 23 provides a simplified flowchart of a seventh specific embodiment of the invention for forming a probe array including the formation of a guide plate in lateral alignment with an array of partially formed probes followed by longitudinally co-locating the guide and partially formed probes, and thereafter continuing fabrication of the probes. Flowchart 2300 sets forth steps, or groups of steps, (A)-(F). Numerous variations of this embodiment are possible and include, for example, (1) many of the alternatives discussed above with regard to FIG. 11, (2) other variations allowed in the generalized flowchart of FIG. 4, (3) variations of set forth in the examples of FIGS. 5-10H, and (4) the steps set forth in the other specific embodiments.

FIGS. 24A-24F provide cut side views of example results of the steps set forth in operational blocks (A)-(F) of FIG. 23. In this example, the formation of an array is exemplified by five probes formed as part of four layers where the probes are to be held at their lower ends by a substrate and laterally positioned near their upper ends, or contact ends, by a guide plate that is formed above the upper ends of the probes and is then lowered (i.e. longitudinally translated) so the probes extend at least partially through the openings in the guide plate and potentially beyond the openings in the guide plate, after which probe formation may continue as appropriate with the eventual result being an array of probes that can undergo elastic compression when made to contact an electronic component. The following states of the process can be seen in FIGS. 24A-24F: (1) a supplied substrate (FIG. 24A), (2) probes formed from a plurality of multi-material layers including a surrounding sacrificial material on all but the last layer which retains a masking material used in the deposition of its structural material (FIG. 24B), (3) formation of a patterned masking material and creation of a guide plate around that masking material wherein the masking material is located in regions to eventually be occupied by probes (FIG. 24C), (4) the partially formed array after removal of the masking material defining through holes and removal of the masking material from around the last layer of the probes, and lowering of the guide plate to engage the probes (FIG. 24D), (5) the probe array after formation of any additional longitudinal portions of the probes (none shown) (FIG. 24E), and (6) the probe array in an uncompressed operational state after an optional relative lateral shifting that provides the probes with a desired placement, shape, and/or configuration (FIG. 24F).

Numerous variations of the above specific embodiments are possible and include, intra alia, for example, (1) many of the alternatives discussed above with regard to FIG. 11, (2) other variations allowed in the generalized flowchart of FIG. 4, (3) variations of set forth in the examples of FIGS. 5-10H, and (4) the steps set forth in the other specific embodiments.

Further Comments and Conclusions

Various other embodiments of the present invention exist. Some of these embodiments may be based on a combination of the teachings herein with various teachings incorporated herein by reference. For example, some fabrication embodiments may not use any blanket deposition process. Some embodiments may use selective deposition processes or blanket deposition processes on some layers that are not electrodeposition processes. Some embodiments may use nickel or nickel-cobalt as a structural material while other embodiments may use different materials. For example, preferred spring materials include nickel (Ni), copper (Cu), beryllium copper (BeCu), nickel phosphorous (Ni-P), tungsten (W), aluminum copper (Al-Cu), steel, P7 alloy, palladium, palladium-cobalt, silver, molybdenum, manganese, brass, chrome, chromium copper (Cr-Cu), and combinations of these. Some embodiments may use copper as the structural material with or without a sacrificial material. Some embodiments, for example, may use nickel, nickel-phosphorous, nickel-cobalt, palladium, palladium-cobalt, gold, copper, tin, silver, zinc, solder, rhodium, rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may remove a sacrificial material while other embodiments may not. Some embodiments may use photoresist, polyimide, glass, ceramics, other polymers, and the like as dielectric structural materials.

Structural or sacrificial dielectric materials may be incorporated into embodiments of the present invention in a variety of different ways. Such materials may form a third material or higher deposited material on selected layers or may form one of the first two materials deposited on some layers. Additional teachings concerning the formation of structures on dielectric substrates and/or the formation of structures that incorporate dielectric materials into the formation process and possibly into the final structures as formed are set forth in a number of patent applications filed Dec. 31, 2003: (1) U.S. Patent Application No. 60/534,184 which is entitled "Electrochemical Fabrication Methods Incorporating Dielectric Materials and/or Using Dielectric Substrates"; (2) U.S. Patent Application No. 60/533,932, which is entitled "Electrochemical Fabrication Methods Using Dielectric Substrates"; (3) U.S. Patent Application No. 60/534,157, which is entitled "Electrochemical Fabrication Methods Incorporating Dielectric Materials"; (4) U.S. Patent Application No. 60/533,891, which is entitled "Methods for Electrochemically Fabricating Structures Incorporating Dielectric Sheets and/or Seed layers That Are Partially Removed Via Planarization"; and (5) U.S. Patent Application No. 60/533,895, which is entitled "Electrochemical Fabrication Method for Producing Multi-layer Three-Dimensional Structures on a Porous Dielectric". These patent filings are each hereby incorporated herein by reference as if set forth in full herein.

Additional patent filings that provide, intra alia, teachings concerning incorporation of dielectrics into electrochemical fabrication processes include: (1) U.S. patent spplication Ser. No. 11/139,262, by Lockard, et al., which was filed May 26, 2005, now U.S. Pat. No. 7,501,328, and which is entitled "Methods for Electrochemically Fabricating Structures Using Adhered Masks, Incorporating Dielectric Sheets, and/or Seed Layers that are Partially Removed Via Planarization"; (2) U.S. patent application No. 11/029,216, by Cohen, et al., which was filed Jan. 3, 2005, now abandoned, and which is entitled "Electrochemical Fabrication Methods Incorporating Dielectric Materials and/or Using Dielectric Substrates"; (3) U.S. patent application Ser. No. 11/028,957, by Cohen, which was filed on Jan. 3, 2005, now abandoned, and which is entitled "Incorporating Dielectric Materials and/or Using Dielectric Substrates"; (4) U.S. patent application Ser. No. 10/841,300, by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (5) U.S. patent application Ser. No. 10/841,378, by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric; (6) U.S. patent application Ser. No. 11/325,405, filed Jan. 3, 2006 by Dennis R. Smalley, now abandoned, and entitled "Method of Forming Electrically Isolated Structures Using Thin Dielectric Coatings"; (7) U.S. patent application Ser. No. 10/607,931, by Brown, et al., which was filed on Jun. 27, 2003, now U.S. Pat. No. 7,239,219, and which is entitled "Miniature RF and Microwave Components and Methods for Fabricating Such Components", (8) U.S. patent application Ser. No. 10/841,006, by Thompson, et al., which was filed on May 7, 2004, now abandoned, and which is entitled "Electrochemically Fabricated Structures Having Dielectric or Active Bases and Methods of and Apparatus for Producing Such Structures"; (9) U.S. patent application Ser. No. 10/434,295, by Cohen, which was filed on May 7, 2003, now abandoned, and which is entitled "Method of and Apparatus for Forming Three-Dimensional Structures Integral With Semiconductor Based Circuitry"; and (10) U.S. patent application Ser. No. 10/677,556, by Cohen, et al., filed Oct. 1, 2003, now abandoned, and which is entitled "Monolithic Structures Including Alignment and/or Retention Fixtures for Accepting Components". These patent filings are each hereby incorporated herein by reference as if set forth in full herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full. This application is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, enhanced methods of using may be implemented, and the like.

| U.S. Pat App No., Filing Date U.S. App Pub No., Pub Date U.S. Patent No., Pub Date | First Named Inventor, Title |
|---|---|
| 10/271,574 - Oct. 15, 2002 2003-0127336 - Jul. 10, 2003 7,288,178 - Oct. 30, 2007 | Cohen, "Methods of and Apparatus for Making High Aspect Ratio Microelectromechanical Structures" |
| 10/387,958 - Mar. 13, 2003 2003-022168 - Dec. 4, 2003 — | Cohen, "Electrochemical Fabrication Method and Application for Producing Three-Dimensional Structures Having Improved Surface Finish" |

-continued

| U.S. Pat App No., Filing Date U.S. App Pub No., Pub Date U.S. Patent No., Pub Date | First Named Inventor, Title |
|---|---|
| 10/434,289 - May 7, 2003 20040065555 - Apr. 8, 2004 — | Zhang, "Conformable Contact Masking Methods and Apparatus Utilizing In Situ Cathodic Activation of a Substrate" |
| 10/434,294 - May 7, 2003 2004-0065550 - Apr. 8, 2004 — | Zhang, "Electrochemical Fabrication Methods With Enhanced Post Deposition Processing" |
| 10/434,315- May 7, 2003 2003-0234179 - Dec. 25, 2003 7,229,542 - Jun. 12, 2007 | Bang, "Methods of and Apparatus for Molding Structures Using Sacrificial Metal Patterns" |
| 10/434,494 - May 7, 2003 2004-0000489 - Jan. 1,2004 — | Zhang, "Methods and Apparatus for Monitoring Deposition Quality During Conformable Contact Mask Plating Operations" |
| 10/677,498 - Oct. 1,2003 2004-0134788 - Jul. 15, 2004 7,235,166 - Jun. 26, 2007 | Cohen, "Multi-cell Masks and Methods and Apparatus for Using Such Masks To Form Three-Dimensional Structures" |
| 10/697,597 - Dec. 20, 2002 2004-0146650 - Jul. 29, 2004 — | Lockard, "EFAB Methods and Apparatus Including Spray Metal or Powder Coating Processes" |
| 10/724,513 - Nov. 26, 2003 2004-0147124 - Jul. 29, 2004 7,368,044 - May 6, 2008 | Cohen, "Non-Conformable Masks and Methods and Apparatus for Forming Three-Dimensional Structures" |
| 10/724,515 - Nov. 26, 2003 2004-0182716 - Sep. 23, 2004 7,291,254 - Nov. 6, 2007 | Cohen, "Method for Electrochemically Forming Structures Including Non-Parallel Mating of Contact Masks and Substrates" |
| 10/830,262 - Apr. 21, 2004 2004-0251142 - Dec. 16, 2004 7,198,704 - Apr. 3, 2007 | Cohen, "Methods of Reducing Interlayer Discontinuities in Electrochemically Fabricated Three-Dimensional Structures" |
| 10/841,100 - May 7, 2004 2005-0032362 - Feb. 10, 2005 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347 - May 7, 2004 2005-0072681 - Apr. 7, 2005 — | Cohen, "Multi-step Release Method for Electrochemically Fabricated Structures" |
| 10/949,744 - Sep. 24, 2004 2005-0126916 - Jun. 16, 2005 7,498,714 - Mar. 3, 2009 | Lockard, "Multi-Layer Three-Dimensional Structures Having Features Smaller Than a Minimum Feature Size Associated with the Formation of Individual Layers" |
| 12/345,624 - Dec. 29, 2008 — 8,070,931 - Dec. 6, 2011 | Cohen, "Electrochemical Fabrication Method Including Elastic Joining of Structures" |
| 14/194,564 - Feb. 28, 2014 2014-0238865 - Aug. 28, 2014 9,540,233 - Jan. 10, 2017 | Kumar, "Methods of Forming Three-Dimensional Structures Having Reduced Stress and/or Curvature" |
| 14/720,719 - May 22, 2015 — 9,878,401 - Jan. 30, 2018 | Veeramani, "Methods of Forming Parts Using Laser Machining" |
| 14/872,033 - Sep. 30,2015 — — | Le, "Multi-Layer, Multi-Material Microscale and Millimeter Scale Batch Part Fabrication Methods Including Disambiguation of Good Parts and Defective Parts" |

It will be understood by those of skill in the art that additional operations may be used in variations of the above presented method of making embodiments. These additional operations may, for example, perform cleaning functions (e.g. between the primary operations discussed herein or discussed in the various materials incorporated herein by reference), perform activation functions and monitoring functions, and the like.

It will also be understood that the probe elements of some aspects of the invention may be formed with processes which are very different from the processes set forth herein, and it is not intended that structural aspects of the invention need to be formed by only those processes taught herein or by processes made obvious by those taught herein.

Though various portions of this specification have been provided with headers, it is not intended that the headers be used to limit the application of teachings found in one portion of the specification from applying to other portions of the specification. For example, alternatives acknowledged in association with one embodiment are intended to apply to all embodiments to the extent that the features of the different embodiments make such applications functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that any aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or be added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. A method of forming a two-dimensional probe array, comprising:
(A) forming a plurality of probes on a substrate with each probe having two ends, and at least one intermediate elastically compliant portion, wherein at least one of the ends is configured as a contact end for making electric contact to a second electrical circuit element while an other end is selected from the group consisting of: (1) a contact end for making pressure based contact to a first electric element, and (2) an attachment end for making a fixed contact to the first circuit element, wherein the plurality of probes are formed with probe-to-probe spacings corresponding to contacts on the second circuit element, wherein the formation of the plurality of probes, comprises:
  (i) forming a plurality of multi-material layers, wherein each successively formed multi-material layer of the plurality of multi-material layers is adhered to a previously formed multi-material layer or a non-multi-material layer that in turn was adhered directly or indirectly to a previously formed multi-material layer, and with each multi-material layer comprising at least two materials, wherein at least one of the at least two materials is at least one structural material and at least one other of the at least two materials is at least one sacrificial material, wherein each multi-material layer defines a cross-section of the plurality of probes, wherein the forming of each multi-material layer comprises:
    (a) depositing at least a first of the at least two materials;
    (b) depositing at least a second of the at least two materials;
    (c) planarizing at least two of the at least two deposited materials, including planarizing at least one structural material and at least one sacrificial material;
(B) providing at least one guide plate having a plurality of openings, and engaging the openings of the at least one guide plate around the probes at a longitudinal level, wherein the providing and the engaging of the probes and the at least one guide plate is selected from at least one process in the group consisting of:
  (i) after forming the probes to have a full length, but prior to removal of all sacrificial material from the probes, positioning at least one guide plate laterally and longitudinally over and around ends of the probes while an end of the probes extends from unremoved sacrificial material by an amount selected from the group consisting of:
    (a) less than a lateral dimension of an individual probe;
    (b) less than a lateral dimension of a spacing between adjacent probes;
    (c) less than a fraction of a height of a probe where the fraction is selected from the group consisting of (1) ½, (2) ⅓, (3) ¼, (4) ⅕, (5) ¹⁄₁₀, and (6) ¹⁄₂₀;
    (d) less than N thicknesses of the guide plate, wherein N is selected from the group consisting of (1) 4, (2) 3, (3) 2, (4) 1, (5) ½, (6) ⅓, and (7) ¼;
    (e) less than an amount selected from the group consisting of 500 microns, 200 microns, 100 microns, 50 microns, 20 microns, 10 microns, and 5 microns;
  (ii) after forming the probes to have only a partial length, positioning the at least one guide plate laterally and longitudinally over and around the ends of the partial length probes, then completing formation of the length of the probes, wherein at a time of positioning of the at least one guide plate, an end of the partially formed probes extends from unremoved sacrificial material by an amount selected from the group consisting of:
    (a) less than a lateral dimension of an individual probe;
    (b) less than a lateral dimension of a spacing between adjacent probes;
    (c) less than a fraction of a height of a probe where the fraction is selected from the group consisting of (1) ½, (2) ⅓, (3) ¼, (4) ⅕, (5) ¹⁄₁₀, and (6) ¹⁄₂₀;
    (d) less than N thicknesses of the guide plate, wherein N is selected from the group consisting of (1) 4, (2) 3, (3) 2, (4) 1, (5) ½, (6) ⅓, and (7) ¼;
    (e) less than an amount selected from the group consisting of (1) 500 microns, (2) 200 microns (3) 100 microns, (4) 50 microns, (5) 20 microns, (6) 10 microns, and (7) 5 microns;
  (iii) prior to forming a first layer of the probes, positioning the at least one guide plate over the substrate, in direct or indirect contact therewith, and then forming the probes through openings in the guide plate;
  (iv) after forming the probes to have a full length, forming the at least one guide plate with openings aligned laterally with the probes and positioned longitudinally with the openings at least partially surrounding portions of the probes while other portions of the probes remain covered with unremoved sacrifical material;
  (v) after forming the probes to have a full length, forming the at least one guide plate with openings aligned laterally with the probes and positioned longitudinally with the openings at least partially surrounding portions of the probes wherein only a portion of a longitudinal length of the probes extend from unremoved sacrificial material at the time of guide plate formation, wherein the portion is selected from the group consisting of:
    (a) less than a lateral dimension of an individual probe;
    (b) less than a lateral dimension of a closest spacing between adjacent probes;
    (c) less than a fraction of a height of a probe where the fraction is selected from the group consisting of (1) ½, (2) ⅓, (3) ¼, (4) ⅕, (5) ¹⁄₁₀, and (6) ¹⁄₂₀;
    (d) less than N thicknesses of the guide plate, wherein N is selected from the group consisting of (1) 4, (2) 3, (3) 2, (4) 1, (5) ½, (6) ⅓, and (7) ¼;
    (e) less than an amount selected from the group consisting of (1) 500 microns, (2) 200 microns (3)

100 microns, (4) 50, microns, (5) 20 microns, (6) 10 microns, and (7) 5 microns;
(vi) after forming the probes to have only a partial length, forming the at least one guide plate over ends of the partial length probes, then completing formation of the length of the probes, wherein at the time of positioning of the at least one guide plate, an end of the partially formed probes extends from unremoved sacrificial material by an amount selected from the group consisting of:
(a) less than a lateral dimension of an individual probe;
(b) less than a lateral dimension of a spacing between adjacent probes;
(c) less than a fraction of a height of a probe where the fraction is selected from the group consisting of (1) ½, (2) ⅓, (3) ¼, (4) ⅕, (5) 1/10, and (6) 1/20;
(d) less than N thicknesses of the guide plate, wherein N is selected from the group consisting of (1) 4, (2) 3, (3) 2, (4) 1, (5) ½, (6) ⅓, and (7) ¼;
(e) less than an amount selected from the group consisting of (1) 500 microns, (2) 200 microns (3) 100 microns, (4) 50 microns, (5) 20 microns, (6) 10 microns, and (7) 5 microns;
(vii) prior to forming a first layer of the probes, forming the at least one guide plate over the substrate, in direct or indirect contact therewith, and then forming the probes through openings in the at least one guide plate;
(vii) after forming the probes to at least partial length, forming the at least one guide plate with openings aligned laterally with the probes but longitudinally above the ends of the probes, and thereafter exposing the ends of the probes by removing a portion of the sacrificial material, and lowering the at least one guide plate longitudinally over and around the ends of the probes; and
(C) after formation of all layers of the probes and after providing and engaging the at least one guide plate, seperating the probes from remaining sacrificial material.

2. The method of claim 1 wherein in the probes additionally comprise engagement features for engaging the at least one guide plate to limit longitudinal motion of the guide plate relative to the probes in at least one direction.

3. The method of claim 2 wherein the longitudinal motion of the at least one guide plate is limited relative to the probes in two perpendicular directions.

4. The method of claim 1 wherein the at least one guide plate comprises at least two guide plates.

5. The method of claim 4 wherein the at least two guide plates comprise at least three guide plates.

6. The method of claim 1, wherein the providing and the engaging of (B) comprises element (i).

7. The method of claim 1, wherein the providing and the engaging of (B) comprises element (ii).

8. The method of claim 1, wherein the providing and the engaging of (B) comprises element (iii).

9. The method of claim 1, wherein the providing and the engaging of (B) comprises element (iv).

10. The method of claim 1, wherein the providing and the engaging of (B) comprises element (v).

11. The method of claim 1, wherein the providing and the engaging of (B) comprises element (vi).

12. The method of claim 1, wherein the providing and the engaging of (B) comprises element (vii).

13. The method of claim 1, wherein the providing and the engaging of (B) comprises element (viii).

14. A method of forming a two-dimensional probe array, comprising:
(A) forming a plurality of probes on a substrate with each probe having two ends, and at least one intermediate elastically compliant portion, wherein at least one of the ends is configured as a contact end for making electric contact to a second electrical circuit element while an other end is selected from the group consisting of: (1) a contact end for making pressure based contact to a first electric element, and (2) an attachment end for making a fixed contact to the first circuit element, wherein the plurality of probes are formed with probe-to-probe spacings corresponding to contacts on the second circuit element, wherein the formation of the plurality of probes, comprises:
(i) forming a plurality of multi-material layers, wherein each successively formed multi-material layer of the plurality of multi-material layers is adhered to a previously formed multi-material layer or a non-multi-material layer that in turn was adhered directly or indirectly to a previously formed multi-material layer, and with each multi-material layer comprising at least two materials, wherein at least one of the at least two materials is at least one structural material and at least one other of the at least two materials is at least one sacrificial material, wherein each multi-material layer defines a cross-section of the plurality of probes, wherein the forming of each multi-material layer comprises:
(a) depositing at least a first of the at least two materials;
(b) depositing at least a second of the at least two materials;
(c) planarizing at least two of the at least two deposited materials, including planarizing at least one structural material and at least one sacrificial material;
(B) providing at least one guide plate having a plurality of openings, and after forming the probes to have a full length but prior to removal of all sacrificial material from the probes, positioning the at least one guide plate laterally and longitudinally over and around ends of the probes with an end of the probes extending from unremoved sacrificial material; and
(C) after formation of all layers of the probes and after providing and engaging the at least one guide plate, separating the probes from remaining sacrificial material.

15. The method of claim 14 wherein at a time of positioning of the at least one guide plate, the probes extend from unremoved sacrificial material by an amount selected from the group consisting of:
(a) less than a lateral dimension of an individual probe;
(b) less than a lateral dimension of a spacing between adjacent probes;
(c) less than a fraction of a height of a probe where the fraction is selected from the group consisting of (1) ½, (2) ⅓, (3) ¼, (4) ⅕, (5) 1/10, and (6) 1/20;
(d) less than N thicknesses of the guide plate, wherein N is selected from the group consisting of (1) 4, (2) 3, (3) 2, (4) 1, (5) ½, (6) ⅓, and (7) ¼; and
(e) less than an amount selected from the group consisting of 500 microns, 200 microns, 100 microns, 50 microns, 20 microns, 10 microns, and 5 microns.

16. The method of claim 14 wherein the at least one guide plate comprises at least two guide plates.

17. A method of forming a two-dimensional probe array, comprising:
  (A) forming a plurality of probes on a substrate with each probe having two ends, and at least one intermediate elastically compliant portion, wherein at least one of the ends is configured as a contact end for making electric contact to a second electrical circuit element while other end is selected from the group consisting of: (1) a contact end for making pressure based contact to a first electric element, and (2) an attachment end for making a fixed contact to the first circuit element, wherein the plurality of probes are formed with probe-to-probe spacings corresponding to contacts on the second circuit element, wherein the formation of the plurality of probes, comprises:
    (i) forming a plurality of multi-material layers, wherein each successively formed multi-material layer of the plurality of multi-material layers is adhered to a previously formed multi-material layer or a non-multi-material layer that in turn was adhered directly or indirectly to a previously formed multi-material layer, and with each multi-material layer comprising at least two materials, wherein at least one of the at least two materials is at least one structural material and at least one other of the at least two materials is at least one sacrificial material, wherein each multi-material layer defines a cross-section of the plurality of probes, wherein the forming of each multi-material layer comprises:
      (a) depositing at least a first of the at least two materials;
      (b) depositing at least a second of the at least two materials;
      (c) planarizing at least two of the at least two deposited materials, including planarizing at least one structural material and at least one sacrificial material;
  (B) providing at least one guide plate having a plurality of openings, and after forming the probes to have only a partial length but before forming the probes to have full length, positioning the at least one guide plate laterally and longitudinally over and around the ends of the partial length probes and then completing formation of the length of the probes, wherein at a time of positioning of the at least one guide plate, an end of the partially formed probes extends from unremoved sacrificial material; and
  (C) after formation of all layers of the probes and after providing and engaging the at least one guide plate, separating the probes from remaining sacrificial material.

18. The method of claim 17 wherein at the time of positioning the at least one guide plate, the partially formed probes extend from unremoved sacrificial material by an amount selected from the group consisting of:
  (a) less than a lateral dimension of an individual probe;
  (b) less than a lateral dimension of a spacing between adjacent probes;
  (c) less than a fraction of a height of a probe where the fraction is selected from the group consisting of (1) ½, (2) ⅓, (3) ¼, (4) ⅕, (5) ¹⁄₁₀, and (6) ¹⁄₂₀;
  (d) less than N thicknesses of the guide plate, wherein N is selected from the group consisting of (1) 4, (2) 3, (3) 2, (4) 1, (5) ½, (6) ⅓, and (7) ¼; and
  (e) less than an amount selected from the group consisting of (1) 500 microns, (2) 200 microns (3) 100 microns, (4) 50 microns, (5) 20 microns, (6) 10 microns, and (7) 5 microns.

19. The method of claim 17 wherein the at least one guide plate comprises at least two guide plates.

* * * * *